(12) United States Patent
Nishida et al.

(10) Patent No.: US 6,360,355 B1
(45) Date of Patent: Mar. 19, 2002

(54) HARDWARE SYNTHESIS METHOD, HARDWARE SYNTHESIS DEVICE, AND RECORDING MEDIUM CONTAINING A HARDWARE SYNTHESIS PROGRAM RECORDED THEREON

(75) Inventors: Koichi Nishida, Tenri (JP); Andrew Kay, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/256,518

(22) Filed: Feb. 23, 1999

(30) Foreign Application Priority Data

Feb. 26, 1998 (JP) ............................................. 10-045887

(51) Int. Cl.[7] ........................... G06F 17/50; H03K 19/00
(52) U.S. Cl. ............................................. 716/18; 716/2
(58) Field of Search ............................. 716/1, 2, 8, 9, 716/10, 11, 18

(56) References Cited

U.S. PATENT DOCUMENTS

| | | | | |
|---|---|---|---|---|
| 5,530,841 A | * | 6/1996 | Gregory et al. | 395/500 |
| 5,581,781 A | * | 12/1996 | Gregory et al. | 395/800 |
| 5,650,948 A | * | 7/1997 | Gafter | 364/578 |
| 5,666,296 A | * | 9/1997 | Gafter | 364/578 |
| 5,691,911 A | * | 11/1997 | Gregory et al. | 364/489 |
| 5,706,205 A | * | 1/1998 | Masuda et al. | 364/489 |
| 5,764,951 A | * | 6/1998 | Ly et al. | 395/500 |
| 5,953,235 A | * | 9/1999 | Gregory et al. | 364/489 |

FOREIGN PATENT DOCUMENTS

| | | |
|---|---|---|
| EP | 0829812 | 3/1998 |
| JP | 2500079 | 3/1996 |

OTHER PUBLICATIONS

GB Search Report for App. No. 9903953.9, mailed Sep. 20, 1999.
"Estimation of Lower Bounds in Scheduling Algorithms for High–Level Synthesis", ACM Transactions on Design Automation of Electronic Systems, vol. 3, No. 2, Apr. 1998, G. Tiruvuri and M. Chung, p. 162–180.
"From Behavioral Description to Systolic Array Based Architectures", IEEE, 1994, A. Balboni, C. Costi, F. Fummi, D. Sciuto, p. 657.
"Data Path Synthesis From A Microcontroller Inntruction Set Specification in Microsyn", Microproccessing and Microprogramming 32 (1991) p. 193–198, H. G. Heck, F. Krohn and Y. Manoli.
"Cyber: High Level Synthesis System From Software Into ASIC", C & C Systems Research Laboratories, NEC Corporation 4–1–1 Miyazaki Miyamae–ku 216, Japan, p. 127–151, K. Wakabayashi. no date.
"Percolation Based Synthesis", IEEE, 1990 p. 444–449, R. Potasman, J. Lis, A. Nicolau, D. Gajski.

* cited by examiner

Primary Examiner—Matthew Smith
Assistant Examiner—Leigh Marie Garbowski
(74) Attorney, Agent, or Firm—Renner, Otto, Boisselle & Sklar

(57) ABSTRACT

A hardware synthesis method for synthesizing a hardwired circuit from a behavioral description written in a language including execution control branch instructions such as an if-goto statement and a switch statement is provided. More specifically, hardware is synthesized by converting a behavioral description including an execution control branch instruction into a control flow graph (CFG) using a branch node and a merge node, converting the CFG into a control data flow graph (CDFG), performing scheduling according to the CDFG, and executing allocation according to the result of the scheduling.

12 Claims, 25 Drawing Sheets

```
if (d==2) goto label_1;     (201)
a=c*d;                      (206)
if (a==3) goto label_end;   (207)
label_1:                    (205)
b=a*2;                      (216)
label_end:                  (213)
EOF;....                    (221)
```

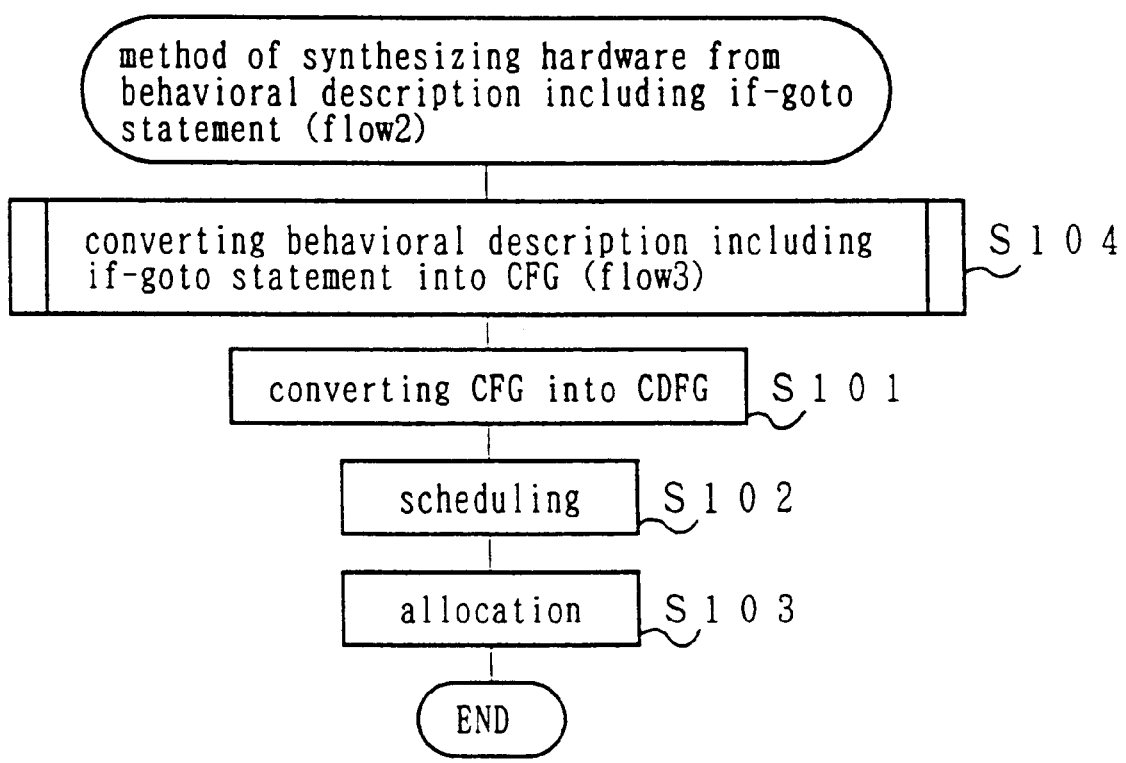

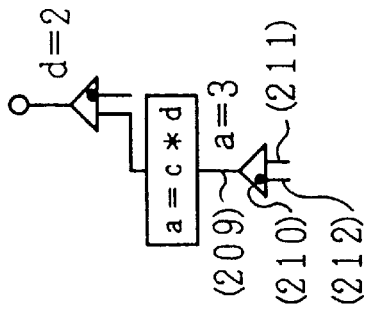
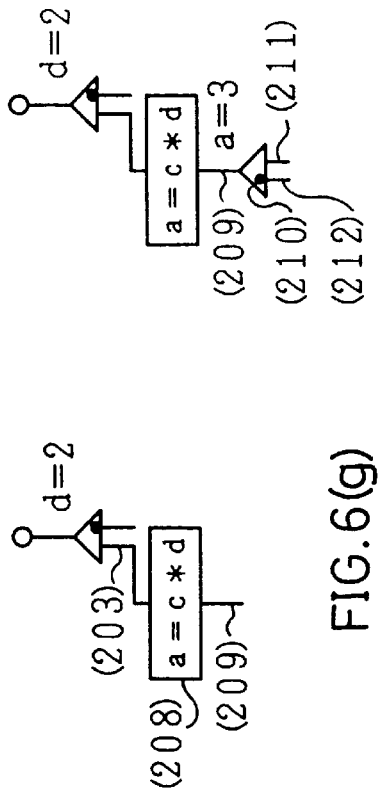
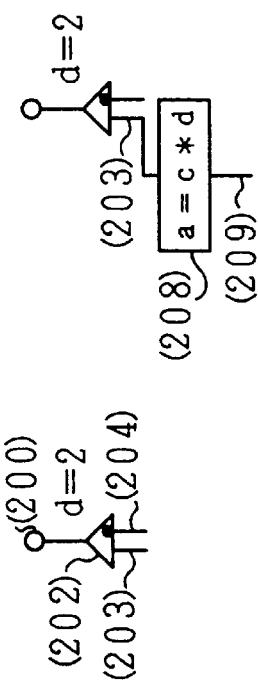
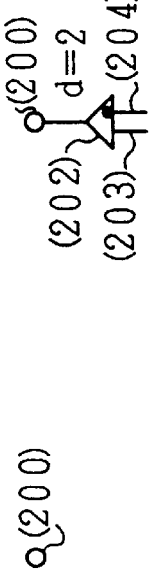
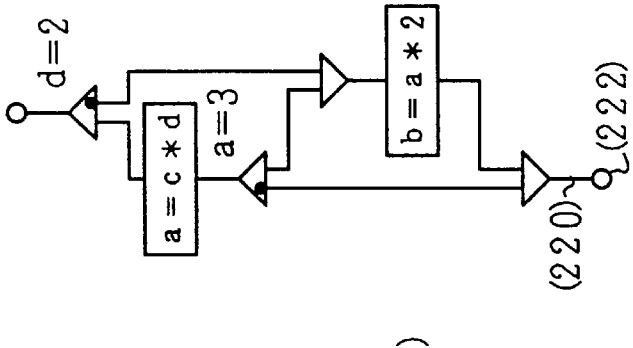
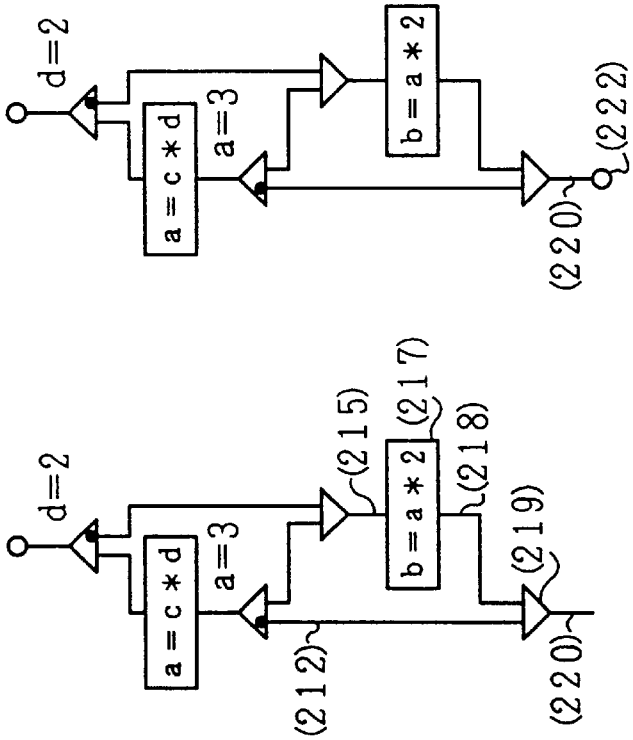
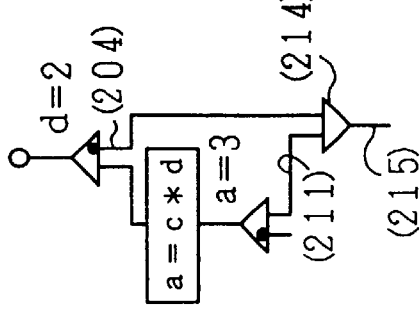

```
switch(a) {
case1:
    d=b*c-d;
    if((b+c)==2) break;
    g=f;
case2:
    f=(d+e)*6;
```

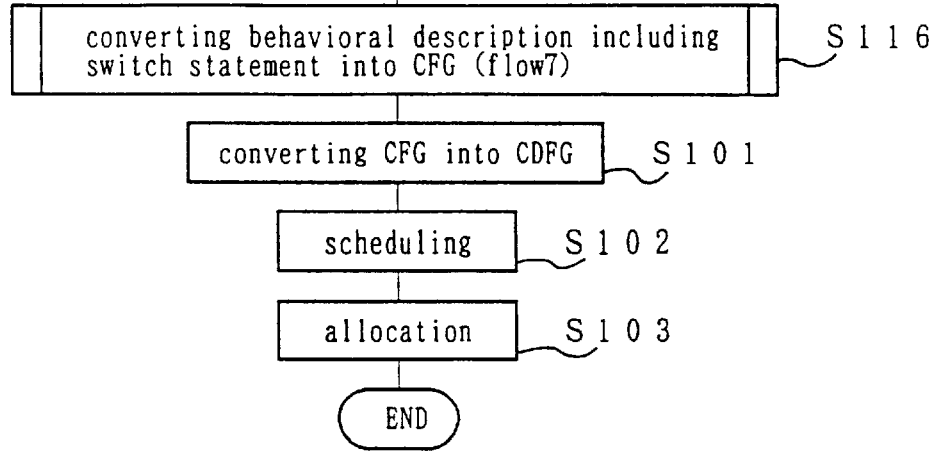
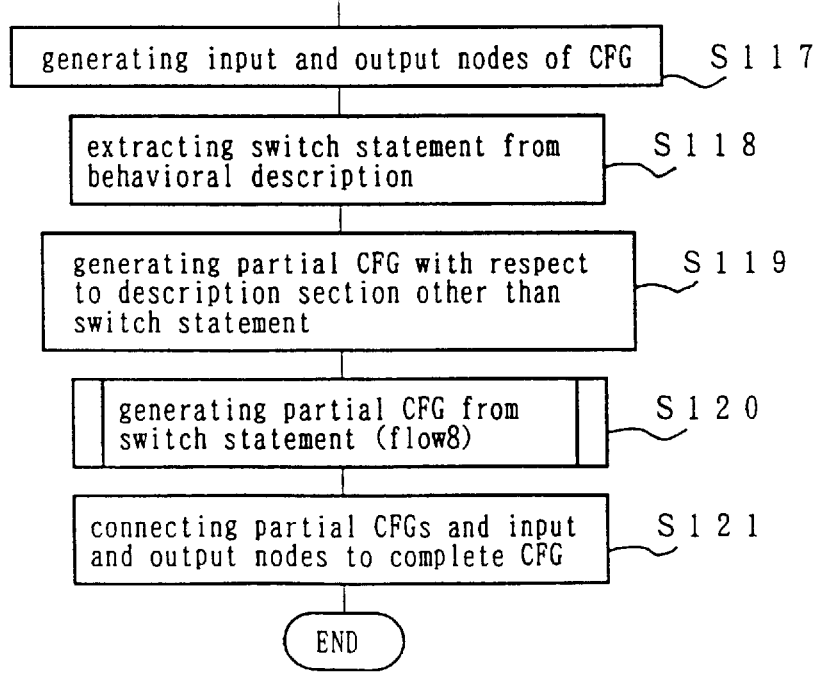

FIG.15(a)

FIG. 16 generating partial CFG from switch statement (flow8)

S122: generating partial CFG whose outputs are control flow branch which becomes active when conditional expression coincides with each case statement and control flow branch which becomes active when conditional expression does not coincide with any case
input of partial CFG corresponding to whole switch statement: = input of this partial CFG S123: search point: = head of subordinate sub-statement of switch statement
connection point: = empty searching description until case constant, if-break statement, break statement, or subordinate sub-statement end point is found while updating search point, and extracting searched description as partial description S124: generating partial CFG from partial description
connecting input of partial CFG to connection point
connection point: = output of partial CFG S125: search point = case constant ?
- YES → S126: processing case constant (flow9)
- NO ↓ search point = if-break statement ?
- YES → S127: processing if-break statement (flow10)
- NO ↓ search point = break statement ?
- YES → S128: processing break statement (flow 11)
- NO ↓

S129: generating merge node
connecting connection point, break point and control flow branch which becomes active when conditional expression does not coincide with any of case constants to inputs of merge node
output of partial CFG corresponding to whole switch statement: = output of merge node

END

HARDWARE SYNTHESIS METHOD, HARDWARE SYNTHESIS DEVICE, AND RECORDING MEDIUM CONTAINING A HARDWARE SYNTHESIS PROGRAM RECORDED THEREON

FIELD OF THE INVENTION

The present invention relates to a high-level synthesis technique for an LSI circuit, for automatically synthesizing a hardwired logic digital circuit from a behavioral description.

BACKGROUND OF THE INVENTION

Conventionally, a high-level synthesis technique has been known as a technique which is particularly effective for designing in a short time, for example, designing an ASIC (Application Specific Integrated Circuit).

High-level synthesis is a technique for automatically synthesizing a circuit from a behavioral description describing only algorithms for processing, without containing information relating to the structure of hardware. One example of documents which describe the details of conventional high-level synthesis techniques is "High-Level Synthesis", Kluwer Academic Publishers.

The following description will briefly explain processes of automatically synthesizing a circuit from a behavioral description, using a conventional high-level synthesis technique.

[1. Conversion of Behavioral Description into CFG]

In high-level synthesis, first, a flow of control (control flow) of execution of a behavioral description is analyzed, and the behavioral description is converted into a model called a control flow graph (CFG) expressing the control flow of execution.

The CFG is a graph similar to a flow chart of a program. For example, the behavioral description shown in FIG. 23(a) is converted into the CFG shown in FIG. 23(b).

The CFG represents sequences (1), (2), (3), (4) of behavior containing no conditional branch in the behavioral description shown in FIG. 23(a) by partial behavioral nodes (5), (6), (7), (8) as shown in FIG. 23(b).

Moreover, the CFG represents a conditional statement (9) of the behavioral description shown in FIG. 23(a) by a branch node (10) and a merge node (11) as shown in FIG. 23(b), and the control flow of execution by control flow branches (12) through (19).

A conditional expression of the conditional statement (9) corresponds to the branch node (10). When the condition is satisfied, the control moves to an output (14) on the true side of the branch node (10). When the condition is not satisfied, the control moves to an output (15) on the false side of the branch node (10).

It is said that, when the condition is satisfied, a control flow branch connected to the output on the true side of the branch node becomes active. Similarly, it is said that, when the condition is not satisfied, a control flow branch connected to the output on the false side of the branch node becomes active.

In the CFG shown in FIG. 23(b), one of the outputs (14), (15) of the branch node (10), which is marked with a black circle, represents the output on the true side. Similarly, in other CFGs later described, an output marked with a black circle in each branch node is the output on the true side.

[2. Conversion of CFG into CDFG]

After the conversion of a behavioral description into a CFG is performed as described above, the data dependence (data flow) of the CFG is analyzed, and then the CFG is converted into a model called control data flow graph (CDFG) expressing the dependence in the execution sequence between operations.

For example, the CFG shown in FIG. 23(b) is converted into the CDFG shown in FIG. 24.

The CDFG is a graph expressing the data dependence and the control dependence by branches by representing operations (20) through (25) and a selector (26) as nodes. Here, the operations (20) through (24) are arithmetic operations, and the operation (25) is a conditional operation.

The operation (25) as a conditional operation outputs a control signal (27) representing whether a conditional decision is true or false. The selector (26) selects one of two inputs according to the value of the control signal (27), and outputs the selected input.

Since the multiplication of b=a*d at the partial behavioral node (5) in the CFG shown in FIG. 23(b) depends on the result of the operation of a=b*c, a branch representing data dependence is present between the operations (20) and (21) in the CDFG.

Since no data dependence exists between the operations (21) and (22), they can be executed parallel. On the other hand, since data dependence exists between the operations (20) and (21), they cannot be executed parallel.

The reason for converting a behavioral description into a CDFG in high-level synthesis is that the CDFG is a behavioral expression which not only ensures the behavior described by the behavioral description, but also allows generation of hardware that achieves parallel processing.

[3. Scheduling]

When the conversion of CFG into CDFG has been completed, scheduling is performed. Scheduling is a process of determining relative times at which input/output, operations, and selection by the selector in the CDFG are to be executed on a circuit.

FIG. 25 shows the result of scheduling the CDFG shown in FIG. 24. According to the result of scheduling, inputs b, c, e, f, output a, and operations (30), (31), (35) are executed in step s1, and input d, outputs b, d, g, operations (32), (33), (36), and selection (34) by the selector are executed in step s2.

[4. Allocation]

Allocation is a process of synthesizing a circuit by allocating arithmetic units to the operation nodes in the CDFG upon receipt of the result of scheduling, generating multiplexers for data selection, registers for data storage and a controller for controlling those and connecting them to each other.

FIG. 26 shows a circuit synthesized by the allocation according to the result of scheduling shown in FIG. 25.

[5. Behavioral Description Language for High-Level Synthesis]

For behavioral descriptions for high-level synthesis, procedure-oriented languages as well as many programming languages are usually used because the human's thinking is consecutive and a behavior described by a procedure-oriented language is easily understood by the human. A typical example of procedure-oriented behavioral description languages is a VHDL language. Many of conventional synthesis tools adopt the VHDL language as the behavioral description language.

However, the VHDL language has not spread widely compared with usual programming languages. Therefore, when hardware is to be designed by an engineer who is unfamiliar with the VHDL language, he/she must learn the VHDL language, irrespective of whether he/she understands other programming languages.

Besides, hardware is designed by a method in which an algorithm is first verified by software and then hardware is realized by a behavioral description language. Namely, in such a method, rewriting from a programming language as a software description language to the VHDL language needs to be performed by an operator.

A typical example of the procedure-oriented programming languages is C language. The C language has been widely used as a language for describing software, and many engineers have already understood the C language. It is thus considered that the C language is suitably used as a behavioral description language for high-level synthesis.

If the C language is used as a behavioral description language for high-level synthesis, the C language used for verifying the algorithm by software can be used directly as an input for high-level synthesis. Hence, rewriting from the programming language into the VHDL language by the operator is not required.

A characteristic of the C language, which is not possessed by the VHDL language, is that the C language supports goto statements and switch statements for dispersing control of execution to another location in the description.

The goto statement is a command which instructs a jump to a description section labelled with the same label as a jump destination label given as an argument of the goto statement. The goto statement can be used as a jump command according to a condition by using it as a subordinate statement of an if statement.

The switch statement is a command for dispersing control of execution to description sections starting from each case according to the value of the conditional expression. If a break statement is executed in a subordinate sub-statement of the switch statement, the switch statement is completed.

When a plurality of execution paths include the same processing, the behavioral description can be shared by the plurality of execution paths by branching control of execution with the use of a goto statement or a switch statement. As a result, the behavior can be described simply.

In the VHDL language, there is a case statement having a function similar to the switch statement. However, the case statement in the VHDL language executes any one of specified processing statements according to the value of the conditional expression, and thus basically differs from the switch statement.

For instance, as shown in FIG. 12(a), with a conventional art, it is impossible to execute the break statement by a condition, or realize processing similar to processing containing no break statement in each case by the case statement in the VHDL language.

When a programming language such as the C language is adopted as a behavioral description language for high-level synthesis, it is necessary to support execution control branch instructions such as the switch statements and if-goto statements. A high-level synthesis system must generate a circuit for executing the behavior of the execution control branch instruction.

In the Neumann processor, the execution control branch instructions such as the switch statement and if-goto statement are executed using jump instructions of the processor. As in a stored program system like the Neumann processor in which instructions are sequentially read out from a memory and the behaviors of the instructions are executed, the jump instruction can be easily executed by inputting the address to which a jump is to be made in a program counter.

However, in a circuit generated by high-level synthesis, the behavioral description is not executed as software on the circuit of the stored program system, but is executed directly as the behavior of hardware on a hardwired circuit. In the hardwired circuit, no program counter exists. Therefore, in order to execute the execution control branch instructions such as the switch statement and if-goto statement, it is necessary to execute on the hardwired circuit the same behavior as that realized by the execution of these instructions.

In order to achieve this, it is necessary to express the behavior of the behavioral description including the execution control branch instructions by a CFG using branch nodes and merge nodes. If the behavior of the behavioral description including the execution control branch instructions is expressed by the CFG using branch nodes and merge nodes, it is possible to produce a hardwired circuit that executes the same behavior as that realized when the execution control branch instructions are executed by the Neumann processor according to the conventional CFG-to-CDFG conversion method, scheduling method, and allocation method. The CFG-to-CDFG conversion method, scheduling method of CDFG, and allocation method have been known in the field of high-level synthesis (see High-Level Synthesis, Kluwer Academic Publishers).

There is a possibility that a plurality of CFGs express the behavior of a single behavioral description. For example, both of the CFG shown in FIG. 3(b) and the CFG shown in FIG. 27 are a CFG expressing the behavior of the behavioral description shown in FIG. 3(a). When the CFG shown in FIG. 3(b) and the CFG shown in FIG. 27 are compared, the efficiency of the CFG shown in FIG. 27 is worse than the CFG shown in FIG. 3(b) because a partial behavior corresponding to the operation of b=a*2 is duplicated in the CFG shown in FIG. 27.

Both of the CFG shown in FIG. 12(b) and the CFG shown in FIG. 28 are a CFG expressing the behavior of the behavioral description shown in FIG. 12(a). When the CFG shown in FIG. 12(b) and the CFG shown in FIG. 28 are compared, the efficiency of the CFG shown in FIG. 28 is worse than the CFG shown in FIG. 12(b) because a partial behavior corresponding to the operation of f=(d+e)*6 is duplicated in the CFG shown in FIG. 28.

A circuit requiring high-speed processing employs a method in which both of a true path and a false path are executed at a branch of the CFG, and a necessary value is selected after a branch condition is determined.

For example, in the CFG shown in FIG. 23(b), only one of two behaviors represented by partial behavioral nodes (6), (7) is required depending on a condition corresponding to a branch node (10). However, according to the result of scheduling shown in FIG. 25 in which the processing is arranged to be completed by two steps, since a conditional decision by an operation (33) is made after performing operations (30), (31) corresponding to the behaviors (6), (7), it is necessary to execute both of the operations (30), (31) in advance.

In order to complete the processing by two steps, it is necessary to execute the operations (30), (31) in step s1, and therefore the operations (30), (31) cannot share a single arithmetic unit. Thus, in the circuit shown in FIG. 26 generated by the result of scheduling shown in FIG. 25, one adder and one subtracter exist for executing the operations (30), (31) concurrently.

On the other hand, if the conditional decision is made before the operations (30), (31) corresponding to the behaviors (6), (7), only one of the operations (30), (31) needs to be executed. In this case, hardware can be decreased by sharing an arithmetic unit. However, the processing cannot be completed by two steps.

As described above, with the use of the method in which both of the true path and false path are executed and then a necessary value is selected after deciding the branch condition, an arithmetic unit cannot be shared between the true path and the false path. Therefore, a partial behavior in the CFG is duplicated as described above, and an arithmetic unit cannot be shared between the duplicate partial behaviors. As a result, the area of the circuit is increased. It is thus necessary to minimize such duplication in generating a CFG.

Note that as a technique relating to the present invention, there is, for example, a program optimization method disclosed in Japanese patent publication of patent No. 2500079 (issued May 29, 1996). However, the method disclosed in this publication is a compiler technique for optimizing the execution performance of a software program including multi-way branch instructions, such as a statement, on condition that the instructions are executed by a stored program type Neumann processor, and is different from the present invention in at least a point that it is not a high-level synthesis technique performed on condition that the behavior of a behavioral description is executed on a hardwired circuit.

SUMMARY OF THE INVENTION

It is an object of the present invention to synthesize a hardwired circuit for executing the behaviors of execution control branch instructions such as if-goto statements and switch statements, rather than executing the behaviors on a stored program type Neumann processor as in the above-mentioned conventional techniques. It is another object of the present invention to generate a CFG without duplicate partial behaviors so as to generate an efficient circuit even when a method in which both of the true path and the false path are executed and a necessary value is selected after a branch condition is determined is adopted.

In order to achieve the above object, a hardware synthesis method according to the present invention is characterized in including the steps of:

(a) converting a behavioral description including an execution control branch instruction into a control flow graph;

(b) converting the control flow graph into a control data flow graph;

(c) performing scheduling according to the control data flow graph; and (d) performing allocation according to the result of scheduling.

With this method, in step (a), a behavioral description including an execution control branch instruction can be expressed by a control flow graph using a branch node and a merge node. By executing steps (b) through (d) sequentially according to the control flow graph, it is possible to synthesize a hardwired circuit for executing the behavior of the execution control branch instruction by converting the control flow graph into a control data flow graph, and performing scheduling and allocation according to the control data flow graph. Namely, an execution control branch instruction such as an if-goto statement or a switch statement can be supported by a behavioral description language for high-level synthesis.

Moreover, a hardware synthesis device according to the present invention is characterized in including:

CFG generating means for converting a behavioral description containing an execution control branch instruction into a control flow graph;

CDFG generating means for converting the control flow graph into a control data flow graph;

scheduling means for performing scheduling according to the control data flow graph; and allocation means for performing allocation according to the result of scheduling.

With this structure, the CFG generating means expresses a behavioral description including an execution control branch instruction by a control flow graph using a branch node and a merge node. According to the control flow graph, the CDFG generating means, scheduling means and allocation means convert the control flow graph into a control data flow graph, and performs scheduling and allocation in accordance with the control data flow graph. As a result, a hardwired circuit for executing the behavior of the execution control branch instruction is synthesized. Namely, a hardware synthesis device supporting execution control branch instructions can be realized by a behavioral description language for high-synthesis.

Furthermore, a recording medium containing a hardware synthesis program recorded thereon according to the present invention is characterized by the hardware synthesis program including the steps of:

(a) converting a behavioral description including an execution control branch instruction into a control flow graph;

(b) converting the control flow graph into a control data flow graph;

(c) performing scheduling according to the control data flow graph; and (d) performing allocation according to the result of scheduling.

With this structure, it is possible to provide means for supporting a behavioral description including an execution control branch instruction by a behavioral description language for high-level synthesis.

For a fuller understanding of the nature and advantages of the invention, reference should be made to the ensuing detailed description taken in conjunction with the accompanying drawings.

BRIEF DESCRIPTION OF THE DRAWINGS

FIG. 4 is a flow chart showing a basic flow of a method of synthesizing hardware from a behavioral description including if-goto statements.

FIGS. 6(a) through 6(g) are explanatory views showings steps of generating the CFG shown in FIG. 3(b) from the behavioral description of FIG. 3(a) according to the flow chart shown in FIG. 5.

FIG. 13 is a flow chart showing a basic flow of a method of synthesizing hardware from a behavioral description including a switch statement.

FIG. 14 is a flow chart showing a process of generating a CFG from a behavioral description including a switch statement.

FIGS. 15(a) through 15(i) are explanatory views showings steps of generating the CFG shown in FIG. 12(b) from the behavioral description of FIG. 12(a) according to the flow chart shown in FIG. 14.

FIG. 16 is a flow chart showing the contents of processing of generating a partial CFG from the switch statement, as one step in the flow chart shown in FIG. 14.

DESCRIPTION OF THE PREFERRED EMBODIMENTS

The following description will explain an embodiment of the present invention with reference to FIGS. 1 to 22.

First, referring to FIG. 2, a schematic structure of a hardware synthesis device for synthesizing hardware from a behavioral description including execution control branch instructions with the use of a high-level synthesis technique will be explained.

Figure 2:
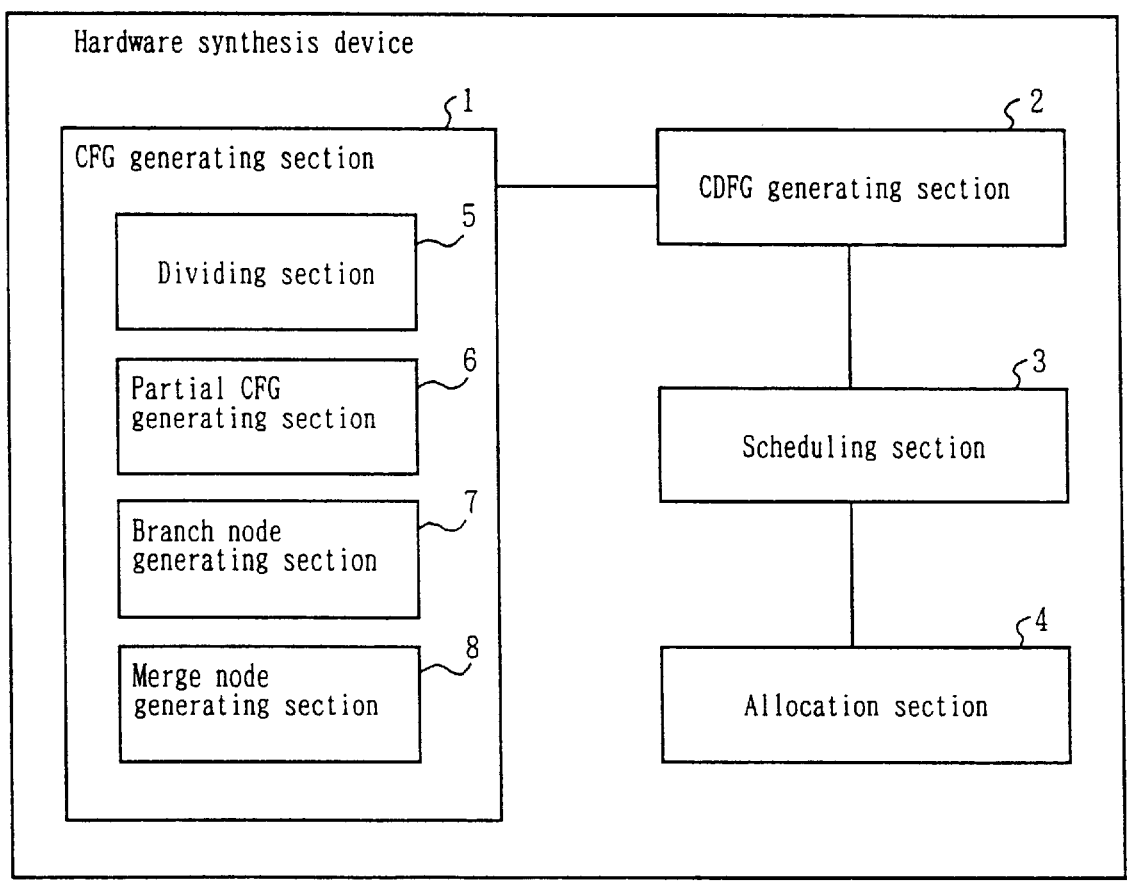
FIG. 2 is a block diagram showing a schematic structure of a hardware synthesis device according to an embodiment of the present invention.

As illustrated in FIG. 2, the hardware synthesis device includes a CFG generating section 1 (CFG generating means), a CDFG generating section 2 (CDFG generating means), a scheduling section 3 (scheduling means), and an allocation section 4 (allocation means).

Figure 1:
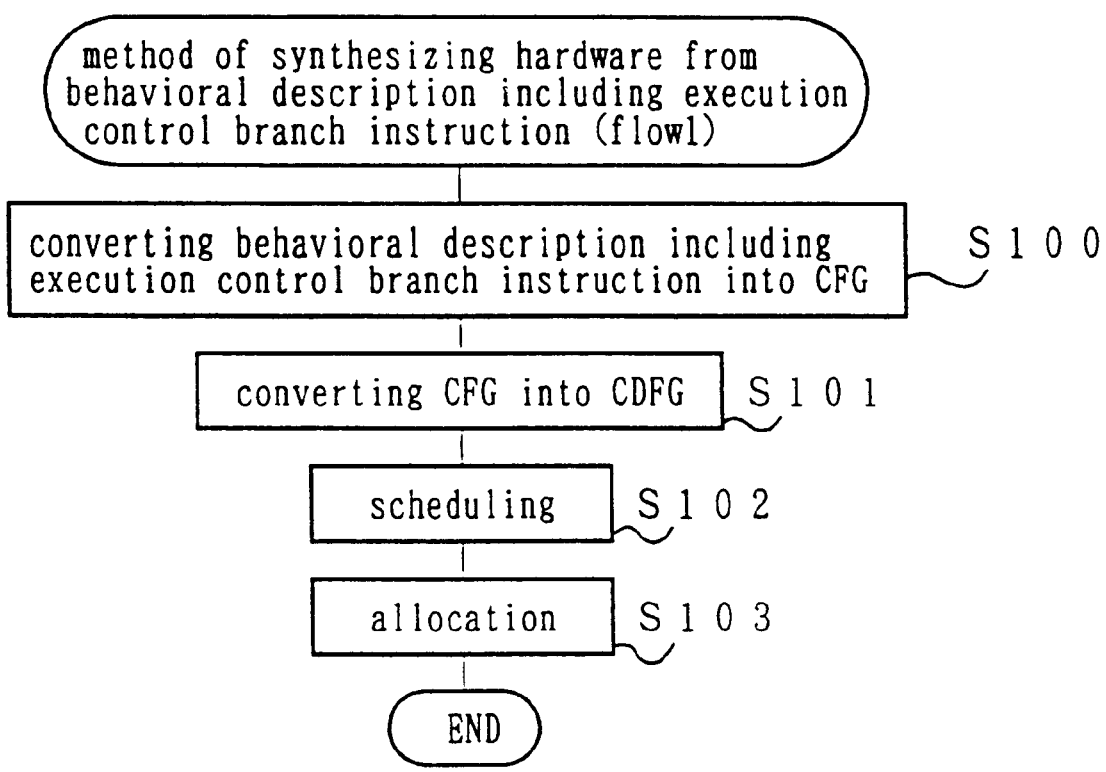
FIG. 1 is a flow chart showing a basic flow of a method of synthesizing hardware from a behavioral description including execution control branch instructions, according to an embodiment of the present invention.

In the hardware synthesis device, as shown in FIG. 1, the CFG generating section 1 converts a behavioral description including execution control branch instructions into a control flow graph (CFG) (step 100, hereinafter described simply as "S100"). The contents of the conversion of the behavioral description into a CFG will be explained in detail later by presenting examples of a behavioral description including an if-goto statement, and a behavioral description including a switch statement.

Next, the CDFG generating section 2 converts the CFG into a control data flow graph (CDFG) (S101), and the scheduling section 3 performs scheduling of determining relative times at which input/output, operations, selection by a selector in the CDFG are executed on a circuit (S102).

Finally, upon receipt of the result of scheduling, the allocation section 4 executes allocation whereby arithmetic units are allocated, registers are allocated, and a controller is generated, etc. (S103).

The following description will explain in detail the technique for synthesizing hardware from a behavioral description including an if-goto statement and a behavioral description including a switch statement.

[Synthesis of Hardware from Behavioral Description including If-goto Statement]

Figures 3A, 3B:
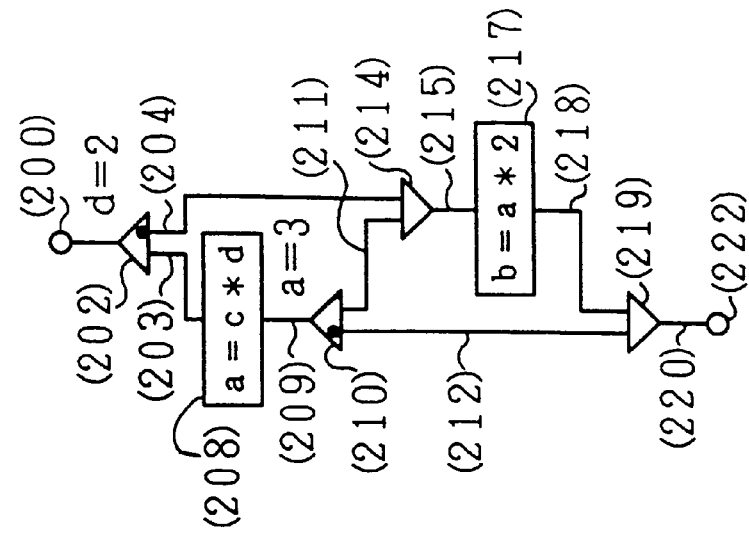
FIG. 3(a) is an explanatory view for illustrating an example of a behavioral description including if-goto statements as execution control branch instructions.
FIG. 3(b) is a control flow graph (CFG) generated according to the behavioral description shown in FIG. 3(a).

Here, a device and method for synthesizing hardware by adopting an algorithm for hardware synthesis from a behavioral description including if-goto statements will be explained with reference to a behavioral description including if-goto statements shown in FIG. 3(a). In FIG. 3(a), EOF represents the end point of the behavioral description.

As illustrated in FIG. 4, in the synthesis of hardware from a behavioral description including if-goto statements, first, the behavioral description including if-goto statements is converted into a CFG (S104), and then processing of S101 through S103 is carried out according to the CFG.

In order to execute the processing of S104 mentioned above, as shown in FIG. 2, the CFG generating section 1 of the hardware synthesis device according to this embodiment includes a dividing section 5 for dividing the behavioral description into partial descriptions separated by an if-goto statement or a jump destination label; a partial CFG generating section 6 for representing each of the partial descriptions by one partial control flow graph; a branch node generating section 7 for generating a branch node corresponding to the if-goto statement and branching control flow branches; and a merge node generating section 8 for generating a merge node corresponding to the jump destination label and merging the control flow branches.

Referring now to the behavioral description shown in FIG. 3(a), the flow chart shown in FIG. 5, and FIGS. 6(a) through 6(g), the following description will explain the contents of the conversion of the behavioral description including an if-goto statement into a CFG, which is to be executed by the CFG generation section 1 in S104.

First, preprocessing is performed (S105). In the preprocessing, as illustrated in FIG. 6(a), an input node (200) of the CFG is generated, and the input node (200) is specified as a connection point. The connection point is a variable for storing a control flow branch to be connected next. Moreover, the head of the behavioral description is specified as a search point. Specifically, in this case, the search point is an if-goto statement (201) located at the head of the behavioral description shown in FIG. 3(a). Incidentally, the search point is a variable for storing a point at which the behavioral description is to be searched.

Next, the behavioral description is divided into partial descriptions (S106). In this processing, the behavioral description is searched while updating the search point until an if-goto statement, a jump destination label, or the behavioral description end point (EOF) is found, and the searched behavioral description is extracted as a partial description. Here, since the search point has already specified an if-goto statement (201), the partial description becomes empty, and the search point is still the if-goto statement (201).

Subsequently, a partial CFG is generated from the extracted partial description (S107). Here, since the partial description is empty, no partial CFG is generated, and the connection point is still the input node (200).

Furthermore, since the search point specifies the if-goto statement (201), processing of the if-goto statement is executed (S108). With this processing, a branch node corresponding to the if-goto statement is generated, and the control flow branches. Therefore, the behavior of the if-goto statement as an execution control branch instruction is expressible by a CFG using a branch node.

Figure 7:
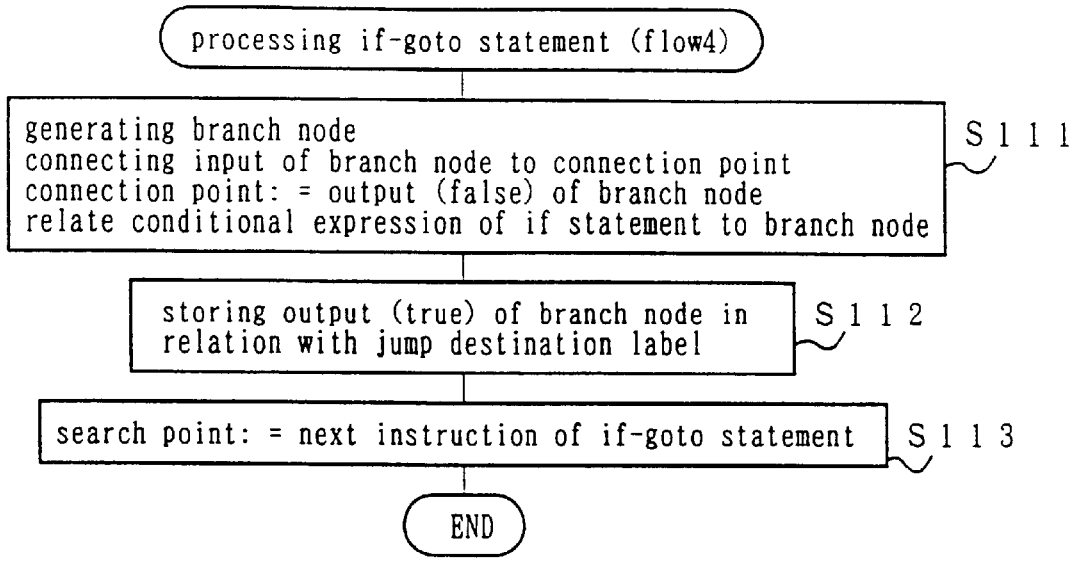
FIG. 7 is a flow chart showing the contents of processing of an if-goto statement, as one step in the flow chart shown in FIG. 5.

Here, the contents of processing of the if-goto statement will be explained with reference to FIG. 7.

First, branching of the control flow corresponding to the if-goto statement is performed (S111). More specifically, a branch node (202) is generated as shown in FIG. 6(b), and its input is connected to the connection point (200). Besides, an output (203) on the false side of the branch node (202) is specified as a connection point, and a conditional expression (d=2) of the if statement is provided for the branch node (202).

Next, as illustrated in FIG. 6(b), an output (204) on the true side of the branch node (202) is stored in relation with a jump destination label (205) (S112). The stored output of the branch node (202) will be merged later at a merge point (214) corresponding to the jump destination label (205).

Subsequently, the search point is moved to a behavioral description (206) as the next instruction of the if-goto statement (201) (S113). Through the above-mentioned processing, the processing of the if-goto statement in S108 is completed.

Figure 5:
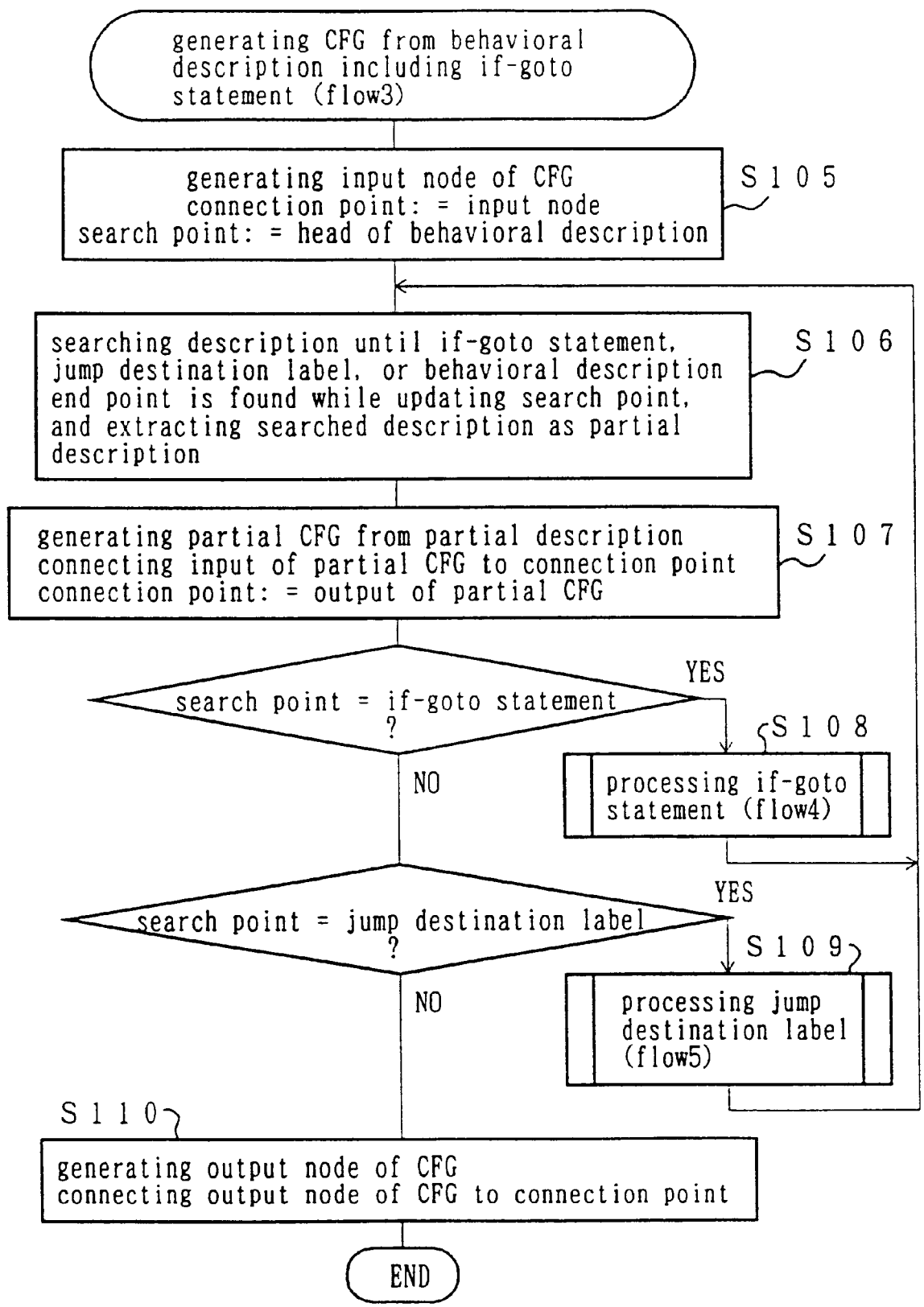
FIG. 5 is a flow chart showing a process of generating a CFG from a behavioral description including if-goto statements.

Then, as shown in FIG. 5, the program moves to the processing of S106, and the processing of dividing a behavioral description into partial descriptions is performed again. In this processing as described above, the behavioral description is searched while updating the search point until an if-goto statement, a jump destination label, or a behavioral description end point is found.

In this search, the searched behavioral description (206) is extracted as a partial description, and the search point specifies an if-goto statement (207) found next.

In the processing of S107, as illustrated in FIG. 6(c), a partial CFG (208) is generated from the extracted partial description (206), and the input of the partial description (208) is connected to the connection point (203). Moreover, the output (209) of the partial CFG (208) is indicated as a connection point.

Next, since the search point specifies the if-goto statement (207), the processing of the if-goto statement is carried out again (S108). Here, similarly to the above-mentioned processing of the if-goto statement, first, as shown in FIG. 6(d), a branch node (210) is generated and its input is connected to the connection point (209) in S111. Additionally, an output (211) on the false side of the branch node (210) is indicated as a connection point, and a conditional expression (a=3) of an if-statement is provided for the branch node (210).

Next, as illustrated in FIG. 6(d), an output (212) on the true side of the branch node (210) is stored in relation with a jump destination label (213) in S112. Furthermore, in S113, the search point is moved to a jump destination label (205) as the next instruction of the if-goto statement (207).

When the processing of the if-goto statement in S108 is completed, the program returns to S106, and the processing of dividing a behavioral description into partial descriptions is performed again. Here, since the search point has already specified the jump destination label (205), the partial description is empty, and the search point is still the jump destination label (205).

Next, in S107, a partial CFG (208) is generated from an extracted partial description. Here, since the partial description is empty, no partial CFG is generated, and the connection point is still the output (211) on the false side of the branch node (210).

Here, since the search point specifies the jump destination label (205), processing of the jump destination label is carried out (S109). In the processing of jump destination label, a merge node is generated, and control flow to the jump destination label is merged. It is therefore possible to express the behavior of the if-goto statement as the execution control branch instruction by a CFG using the merge node.

Figure 8:
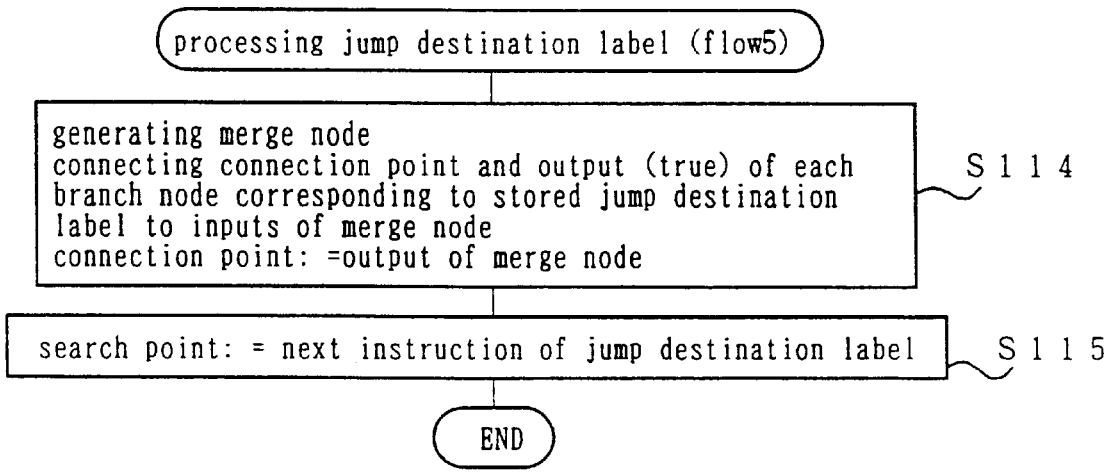
FIG. 8 is a flow chart showing the contents of processing of a jump destination label, as one step in the flow chart shown in FIG. 5.

Referring now to the flow chart shown in FIG. 8, the following description will explain the contents of the processing of the jump destination label in S109.

First, as illustrated in FIG. 6(e), a merge node (214) is generated, and the connection point (211) and the output (204) on the true side of the branch node (202) corresponding to the stored jump destination label (205) are connected to the input of the merge node (214) (S114). Simultaneously, the output (215) of the merge node (214) is specified as a connection point.

Next, the search point is moved to a behavioral description (216) as the next instruction of the jump destination label (205) (S115).

Subsequently, similarly to the above, as shown in FIG. 6(f), a partial CFG (217) is generated, the input of the partial CFG (217) is connected to the connection point (215), and the output (218) of the partial CFG (217) is specified as a connection point. Moreover, a merge node (219) is generated, the connection point (218) and the output (212) on the true side of the branch node (210) corresponding to the stored jump destination label (213) are connected to the inputs of the merge node (219), and the output (220) of the merge node (219) is specified as connection point.

Finally, postprocessing is performed (S101). In the postprocessing, as illustrated in FIG. 6(g), an output node (222) of the CFG is generated, and the output (220) as the connection point is connected to the output node (222).

As described above, after the generation of the CFG from the behavioral description, by performing the conversion of the CFG into to the CDFG (S101), scheduling (S102), and allocation (S103) by known methods, the synthesis of hardware is completed. A typical example of scheduling is a force-directed method, and a typical example of allocation is a method using clique partitioning (see High-Level Synthesis, Kluwer Academic Publishers).

Figure 9:
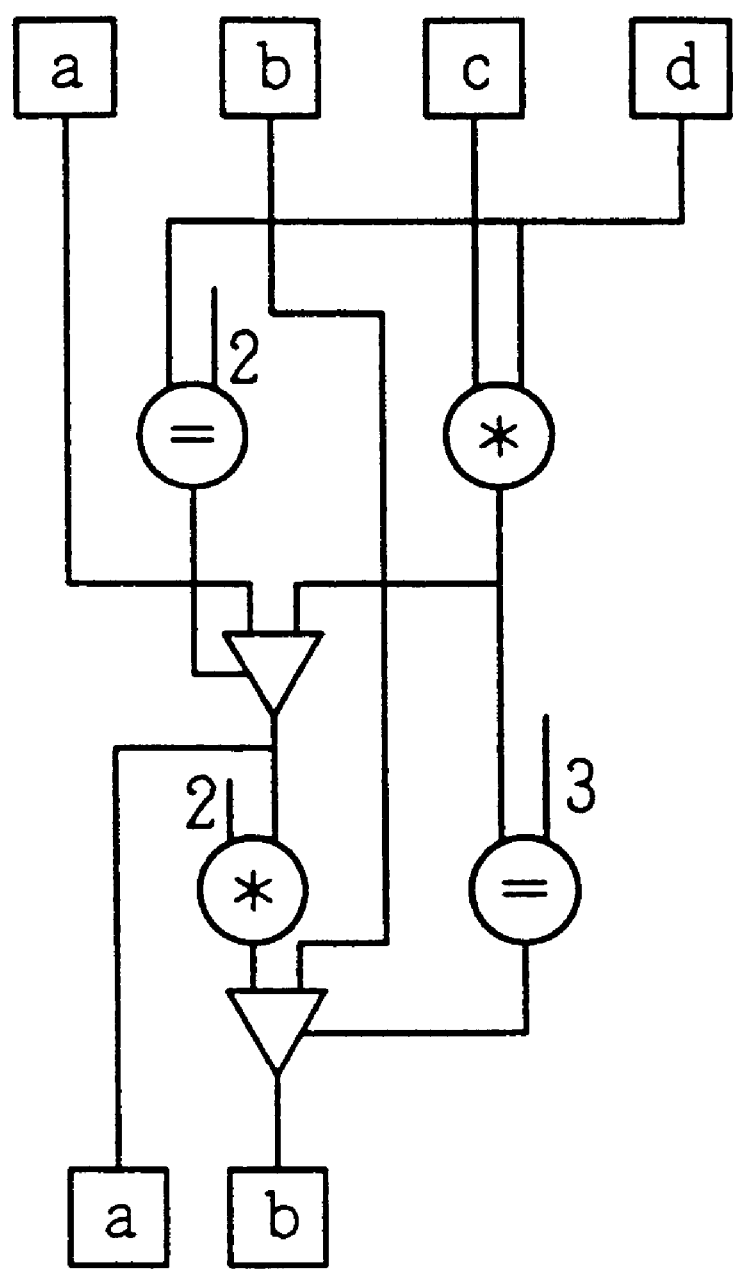
FIG. 9 is a control data flow graph (CDFG) generated from the CFG shown in FIG. 3(b).
Figure 10:
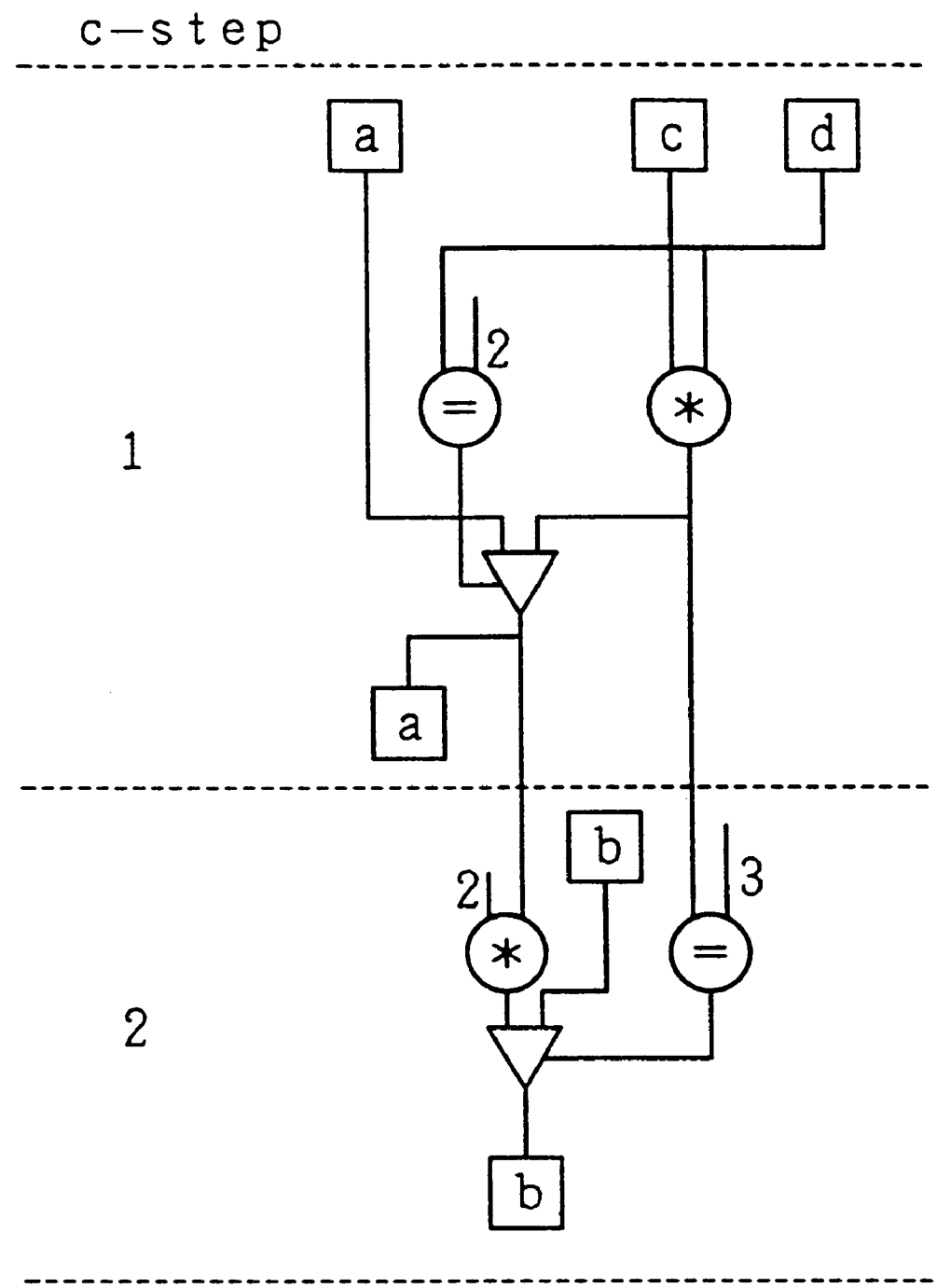
FIG. 10 is an explanatory view showing the result of scheduling according to the CDFG shown in FIG. 9.
Figure 11:
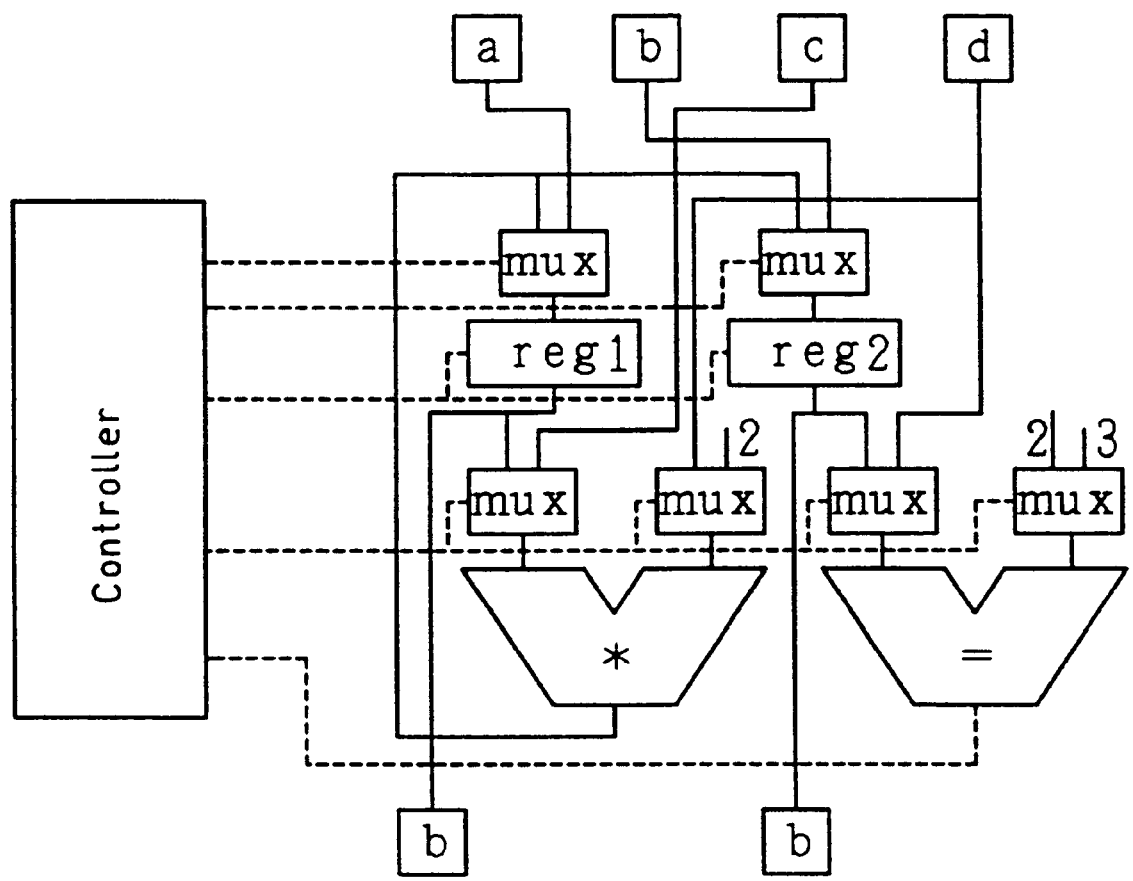
FIG. 11 is an explanatory view showing the result of allocation according to the result of scheduling shown in FIG. 10.

FIG. 9 shows the CDFG produced by converting the CFG, FIG. 10 shows the result of scheduling, and FIG. 11 shows final hardware generated by the allocation.

[Synthesis of Hardware from Behavioral Description Containing Switch Statement]

Figures 12A, 12B:
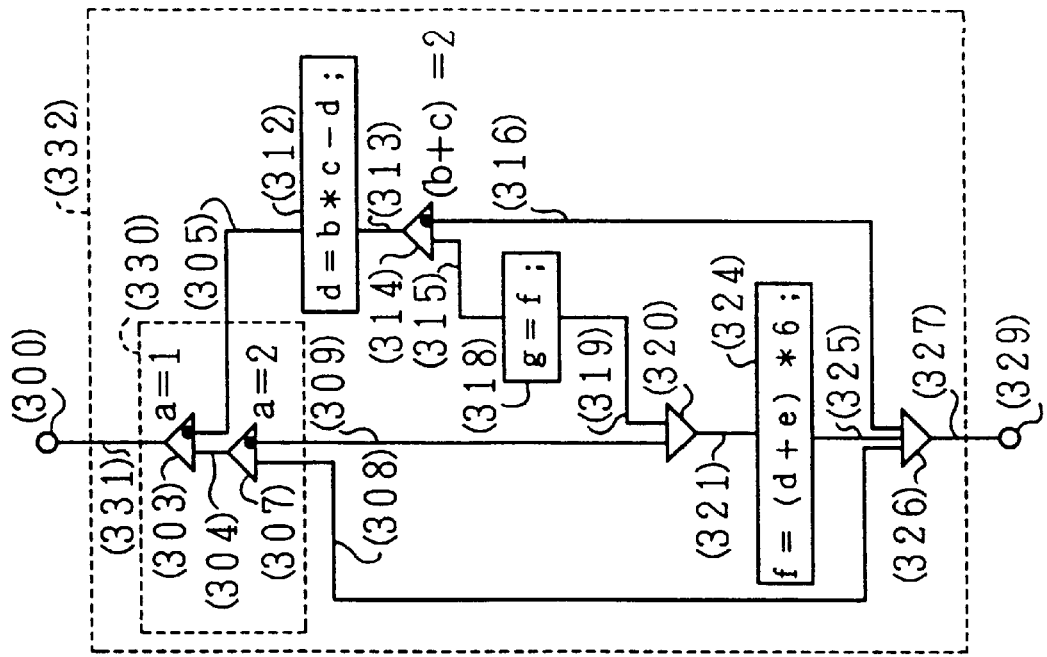
FIG. 12(a) is an explanatory view showing an example of a behavioral description including a switch statement as an execution control branch instruction.
FIG. 12(b) is a CFG generated according to the behavioral description shown in FIG. 12(a).

Next, the following description will explain a method of synthesizing hardware by adopting an algorithm of a method of synthesizing hardware from a behavioral description containing a switch statement, with reference to a behavioral description containing a switch statement as shown in FIG. 12(a).

As illustrated in FIG. 13, in the synthesis of hardware from a behavioral description containing a switch statement, first, the behavioral description containing the switch statement is converted into a CFG (S116), and then processing of S101 through S103 is performed according to the CFG.

In order to execute the processing of S116, in a hardware synthesis device according to this embodiment, the dividing section 6 of the CFG generating section 1 divides a subordinate sub-statement of the switch statement into partial descriptions separated by a case constant, a break statement, or an if-break statement. The branch node generating section 7 generates a branch node corresponding to a conditional expression of the switch statement or the if-break statement and branches control flow branches. The merge node generating section 8 generates a merge node corresponding to the case constant or the subordinate sub-statement end point and merges the control flow branches.

Referring now to the flow chart shown in FIG. 14 and FIGS. 15(a) through 15(i), the following description will explain the detailed contents of the conversion of the behavioral description containing the switch statement into a CFG in S116.

First, preprocessing is performed (S117). In the preprocessing, as shown in FIG. 15(a), an input node (300) and an output node (329) of the CFG are generated.

Next, in S118, a switch statement is extracted from the behavioral description. Here, since the behavioral description shown in FIG. 12(a) consists only of the switch statement, the whole behavioral description is extracted as the switch statement.

Subsequently, in S119, partial CFGs are generated with respect to description sections other than the switch statement. Here, since the behavioral description shown in FIG. 12(a) consists only of the switch statement, no partial CFG corresponding to a description section other than the switch statement is generated.

Figure 15B:
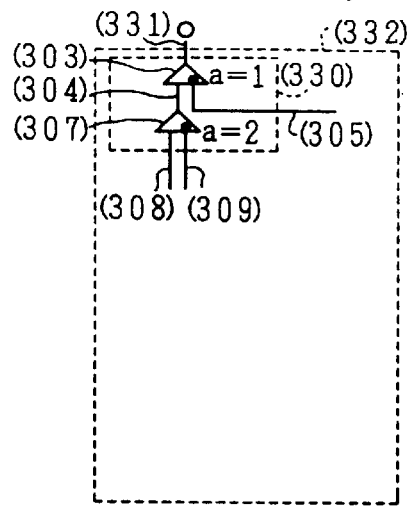

In the following S120, as shown in FIG. 15(b), a partial CFG (332) is generated with respect to the extracted switch statement, i.e., the behavioral description as itself shown in FIG. 12(a).

Referring now to FIG. 16, the following description will explain the contents of generating the partial CFG in S120.

First, in S122, as illustrated in FIG. 15(b), branch nodes (303), (307) are generated and connected to each other to generate a partial CFG (330). The partial CFG (330) includes, as outputs, control flow branches (305), (309) which become active when variable a in a conditional expression (301) of the behavioral description shown in FIG. 12(a) coincides with case constants (302) and (306), respectively, and a control flow branch (308) which becomes active when the variable a does not coincide with either of the case constants, is generated.

The input of the partial CFG (332) corresponding to the whole switch statement is specified as an input (331) of the generated partial CFG (330). It is thus possible to generate a CFG which expresses the behavior of the switch statement using branch nodes.

Next, in S123, the case constant (302) at the head of a subordinate sub-statement of the switch statement is specified as the search point, and the connection point is made empty.

In S124, the behavioral description is searched while updating the search point until a case constant, an if-break statement, a break statement, or a subordinate sub-statement end point is found, and the searched behavioral description is extracted as a partial description. Here, since the search point has already specified the case constant (302), the partial description is empty, and the search point is still the case constant (302).

In S125, a partial CFG is generated from the extracted partial description. Here, since the partial description is empty, no partial CFG is generated, and the connection point remains empty.

By performing the processing of S124 and S125, only one partial CFG is generated for each partial description, and therefore one partial description corresponds to one partial CFG. It is thus possible to generate a CFG without duplication.

Subsequently, since the search point specifies the case constant (302), the program moves to S126, and processing of the case constant is executed. Here, the contents of the processing of the case constant in S126 will be explained with reference to FIG. 17.

First, since the connection point is empty, as shown in FIG. 15(b), a control flow branch (305) which becomes active when the variable a in the conditional expression (301) coincides with the case constant (302) becomes the connection point in S131.

In S132, the behavioral description (310) as the next instruction of the case constant (302) is specified as the search point. In S124, the behavioral description is searched while updating the search point until a case constant, an if-break statement, a break statement, or a subordinate sub-statement end point is found, and the searched behavioral description (310) is extracted as a partial description. In this case, the search point specifies the found if-freak statement (311).

Figure 15C:
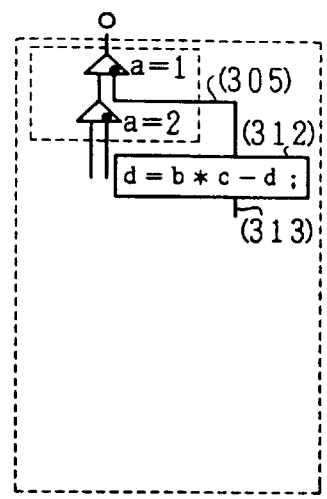

In S125, a partial CFG (312) is generated from the behavioral description (310) extracted as the partial description. Moreover, as illustrated in FIG. 15(c), the input of the partial CFG (312) is connected to the connection point (305), and the output (313) of the partial CFG (312) is specified as a new connection point.

Figure 18:
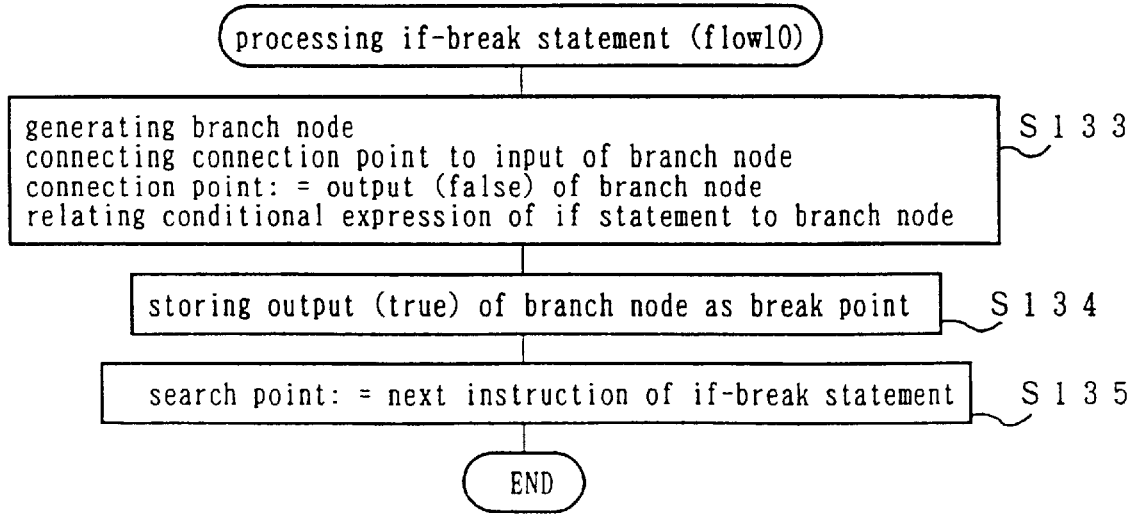
FIG. 18 is a flow chart showing the contents of processing of an if-break statement, as one step in the flow chart shown in FIG. 16.
Figure 19:
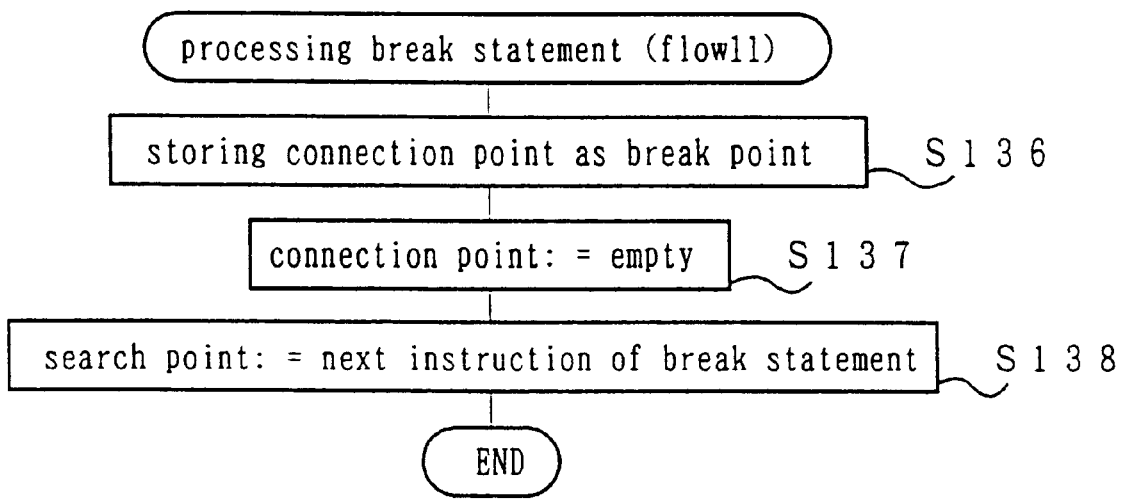
FIG. 19 is flow chart showing the contents of processing of a break statement, as one step in the flow chart shown in FIG. 16.

Next, since the search point specifies the if-break statement (311), processing of the if-break statement (S127) is performed. With this processing, a CFG expressing the behavior of the switch statement containing the if-break statement, using branch nodes, can be generated. Referring now to FIG. 18, the following description will explain the contents of the processing of the if-break statement of S127.

First, in S133, a branch node (314) is generated, and the input of the branch node (314) is connected to the connection point (313). Moreover, as illustrated in FIG. 15(d), an output (315) on the false side of the branch node (314) is specified as a connection point, and a conditional expression ((b+c)=2) of an if-statement is provided for the branch node (314).

Figure 15D:
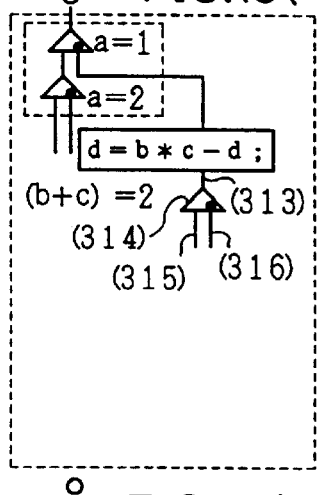

Next, in S134, as illustrated in FIG. 15(d), an output (316) on the true side of the branch node (314) is stored as a break point. The break point is a point which becomes active when break is executed.

Furthermore, in S135, the next instruction (317) of the if-break statement is specified as the search point.

In S124, the behavioral description is searched while updating the search point until a case constant, an if-break statement, a break statement, or a subordinate sub-statement end point is found, and the searched behavioral description (317) is extracted as a partial description. In this case, the search point specifies a case constant (306) found.

Figure 15E:
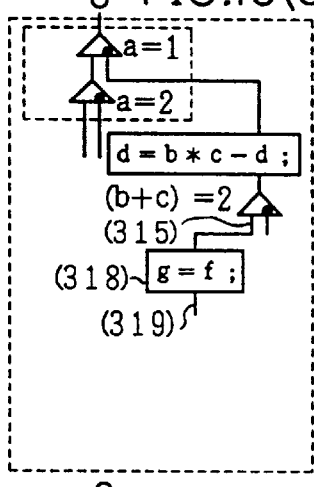

In S125, a partial CFG (318) is generated from the extracted partial description (317). Moreover, as illustrated in FIG. 15(e), the input of the partial CFG (318) is connected to the connection point (315), and an output (319) of the partial CFG (318) is specified as a new connection point.

Next, since the search point specifies the case constant (306), the above-mentioned processing of the case constant of S126 is performed. With this processing, it is possible to generate a CFG expressing the behavior of the switch statement using a merge node.

Figure 15F:
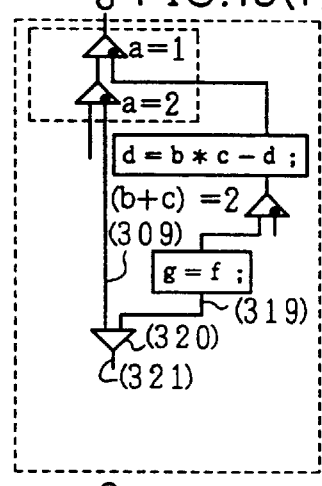

Here, since the connection point is not empty, a merge node (320) is generated in S130 as shown in FIG. 15(f). The connection point (319) and a control flow branch (309) which becomes active when the variable a in the conditional expression (301) coincides with the case constant (306) are connected to the inputs of the merge node (320). Besides, the output (321) of the merge node (320) is specified as a connection point.

Next, by the processing of S132, the search point is moved to the next instruction (322) of the case constant (306).

Figure 15G:
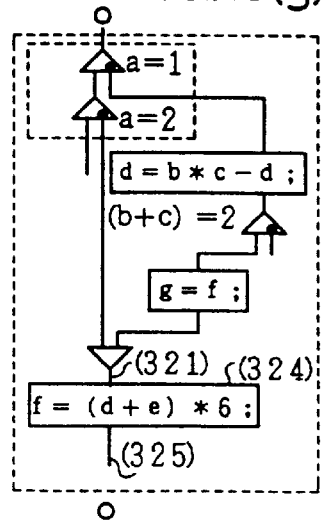

In the same manner as above, a partial description (322) is extracted in S124, and a partial CFG (324) is generated and the input of the partial CFG (324) is connected to the connection point (321) as shown in FIG. 15(g). The output (325) of the partial CFG (324) is specified as a new connection point, and the search point is moved to the subordinate sub-statement end point (323).

Figure 15H:
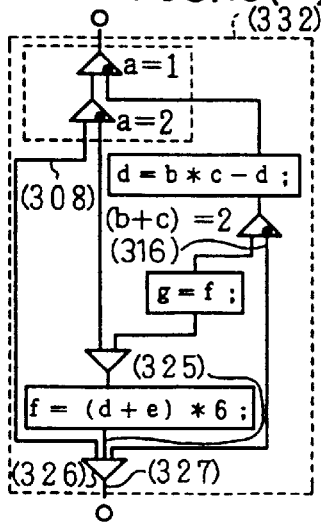

Here, since the search point is neither the case constant, if-break statement nor break statement, a merge node (326) is generated in S129. As illustrated in FIG. 15(h), the connection point (325), the break point (316) and a control flow branch (308) which becomes active when the conditional expression does not coincide with any of case constants are connected to the inputs of the merge node (326).

In addition, the output of the CFG (332) corresponding to the whole switch statement is specified as the output (327) of the merge node (326). With this processing, it is possible to generate a CFG expressing the behavior of the switch statement using a merge node.

Figure 15I:
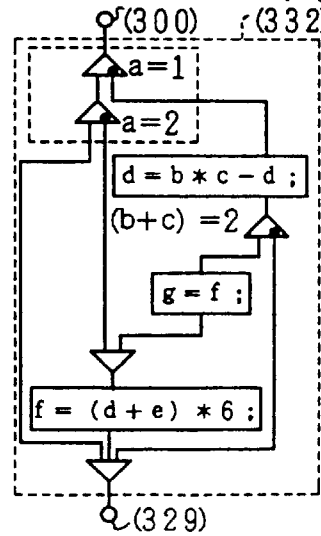
Figure 17:
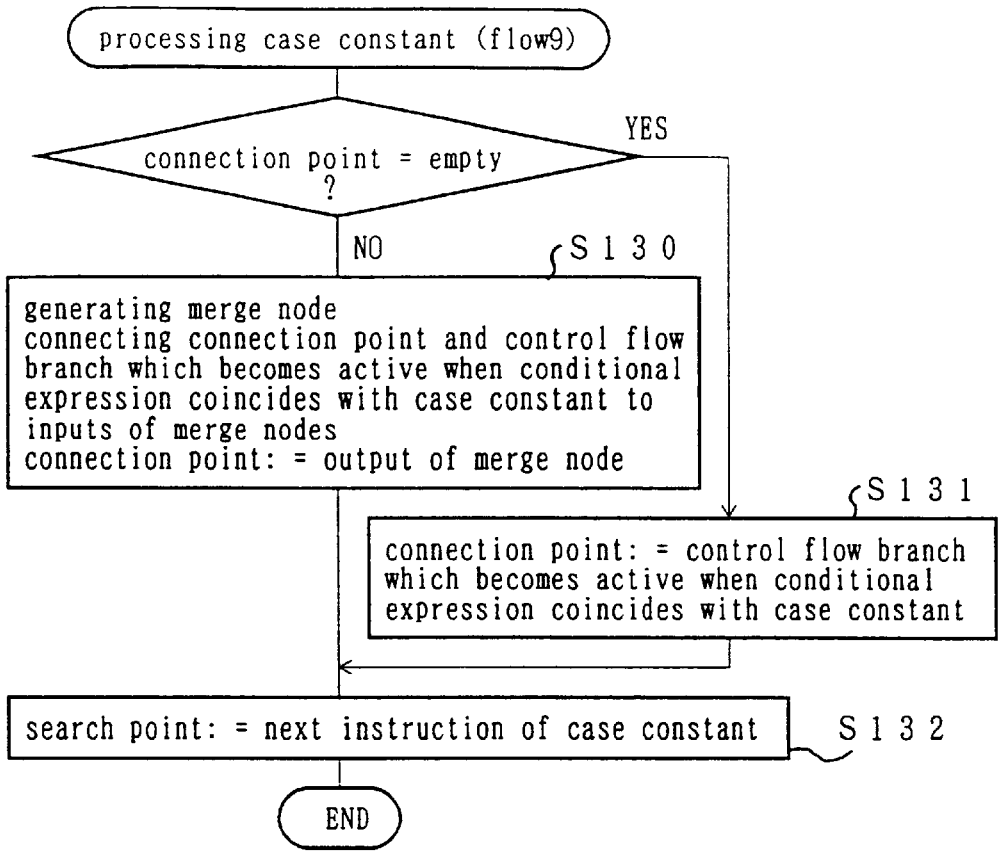
FIG. 17 is a flow chart showing the contents of processing of a case constant, as one step in the flow chart shown in FIG. 16.

In S121, as illustrated in FIG. 15(i), the partial CFG (332), input node (300), and output node (329) are connected to complete a CFG.

Thereafter, as shown in FIG. 13, the conversion of the CFG into the CDFG (S101), scheduling (S102), and allocation (S103) are performed by known methods.

Figure 20:
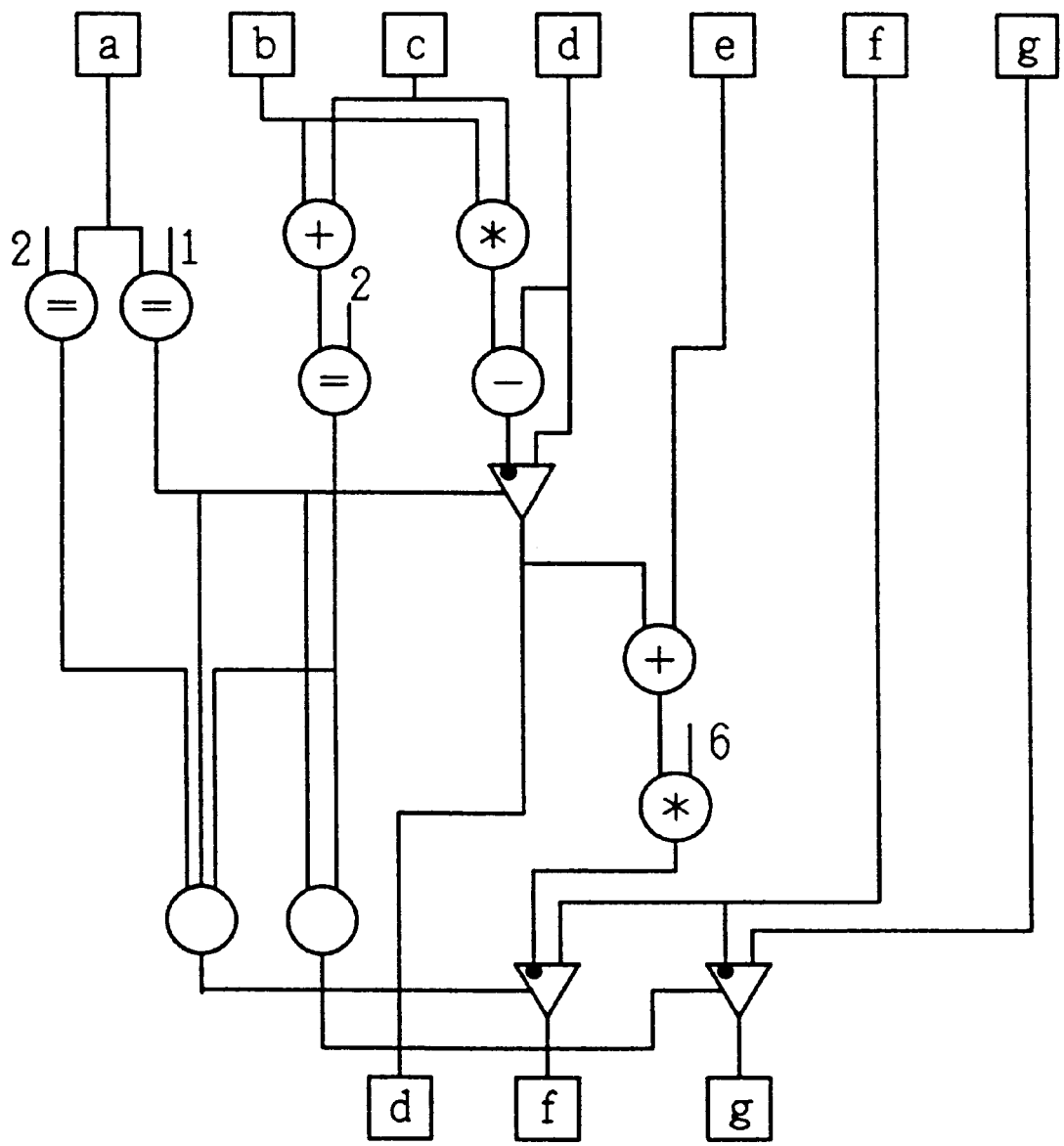
FIG. 20 is a CDFG generated from the CFG shown in FIG. 12(b).
Figure 21:
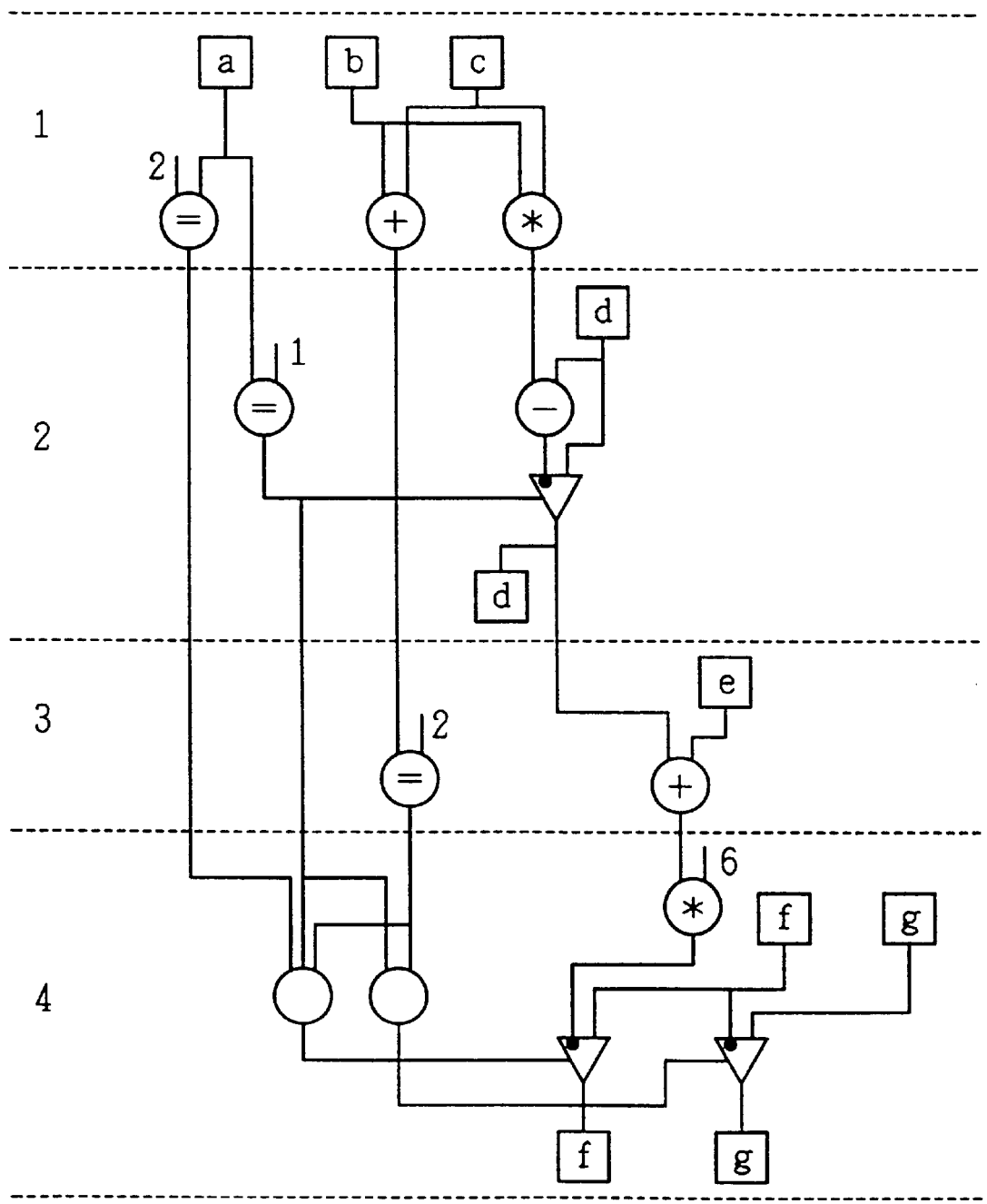
FIG. 21 is an explanatory view showing the result of scheduling according to the CDFG shown in FIG. 20.
Figure 22:
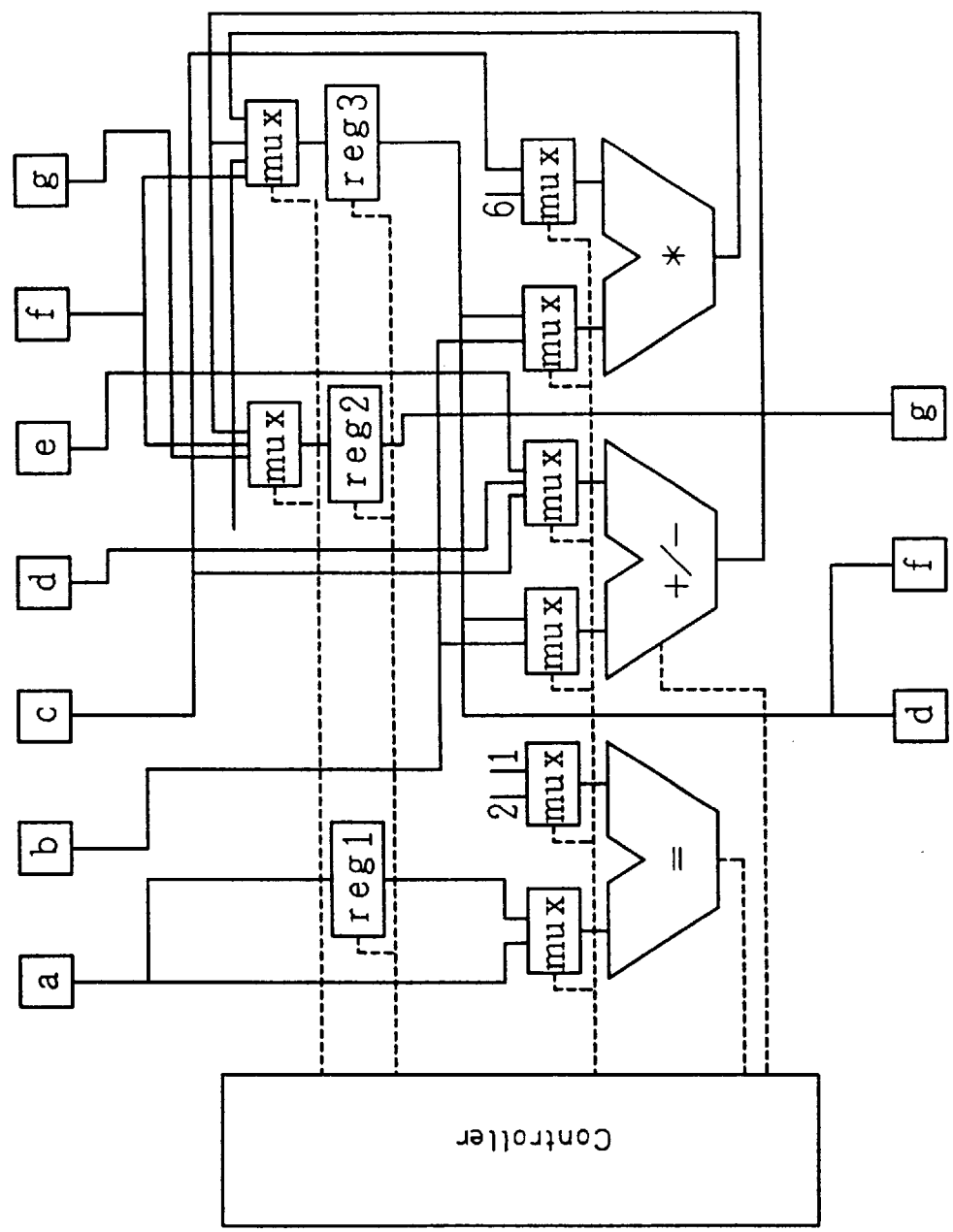
FIG. 22 is an explanatory view showing the result of allocation according to the result of scheduling shown in FIG. 21.
Figure 23:
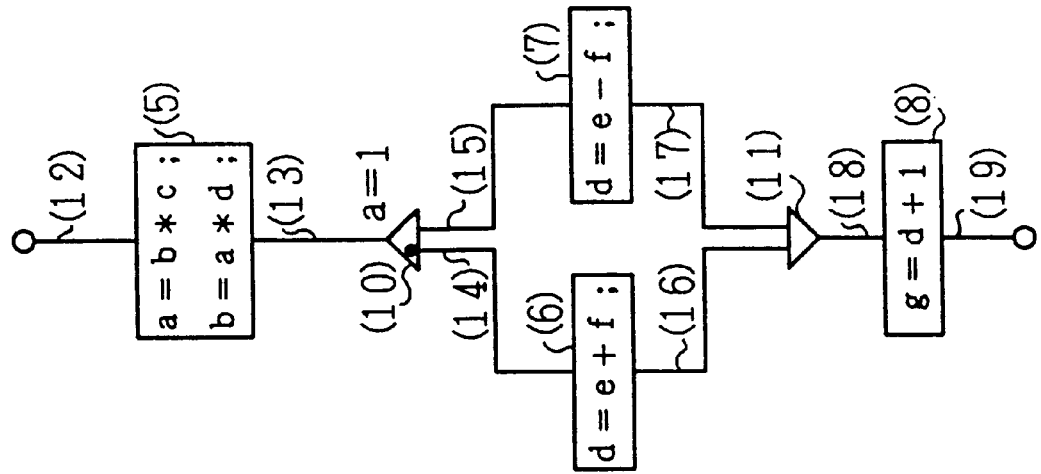
FIG. 23(a) is an explanatory view showing an example of a behavioral description including a conditional branch.
FIG. 23(b) is a CFG generated from the behavioral description.
Figure 24:
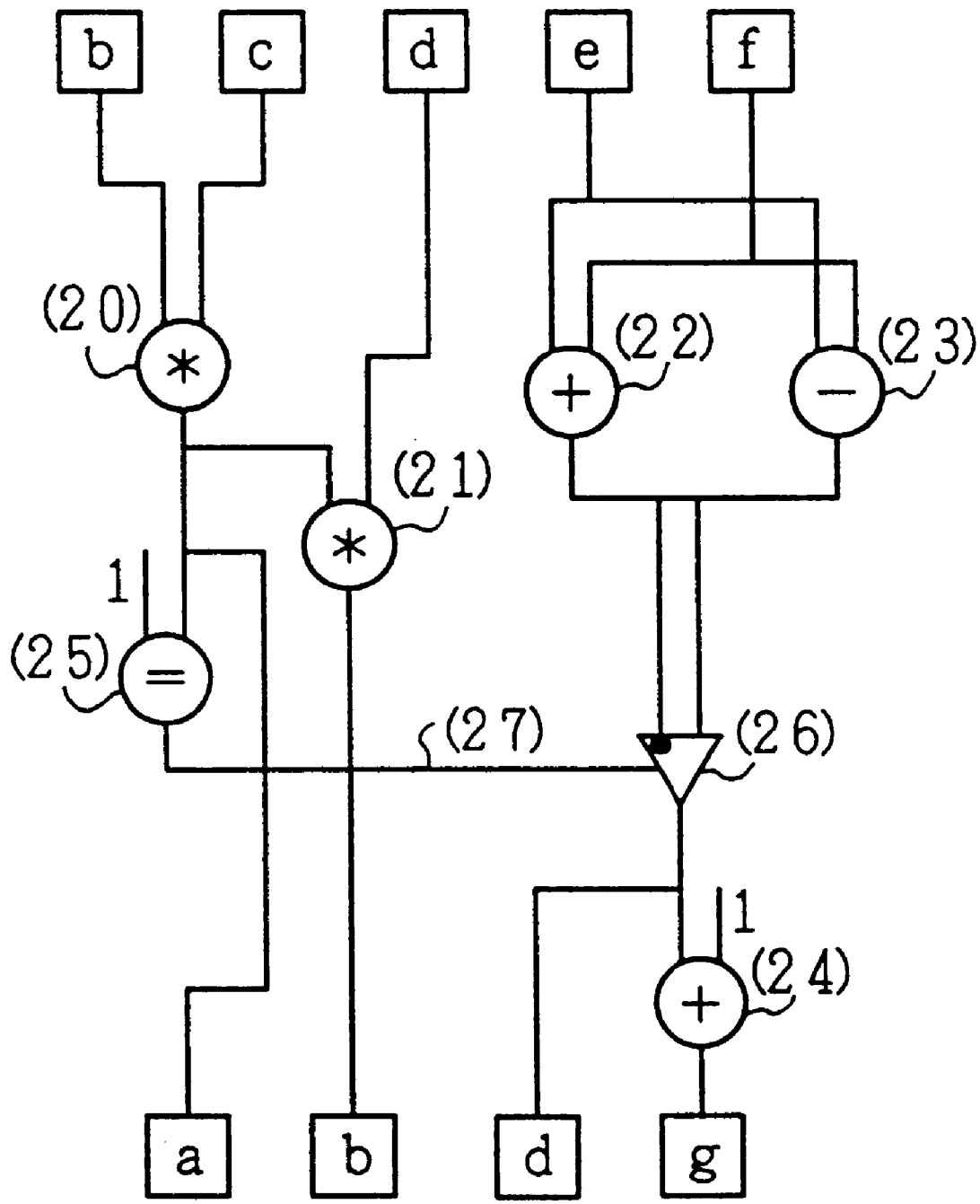
FIG. 24 is a CDFG generated from the CFG shown in FIG. 23(b).
Figure 25:
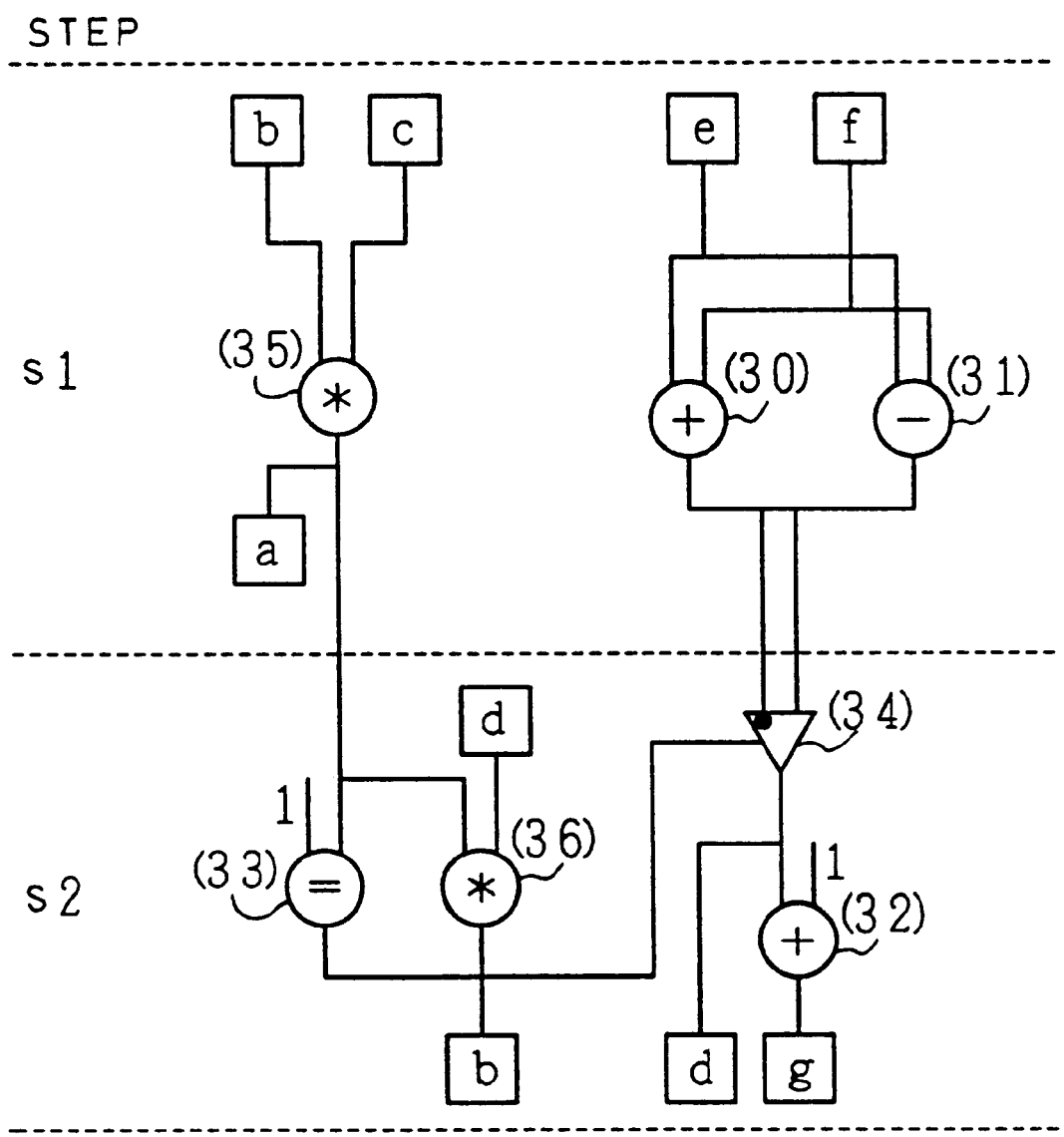
FIG. 25 is an explanatory view showing the result of scheduling according to the CDFG shown in FIG. 24.
Figure 26:
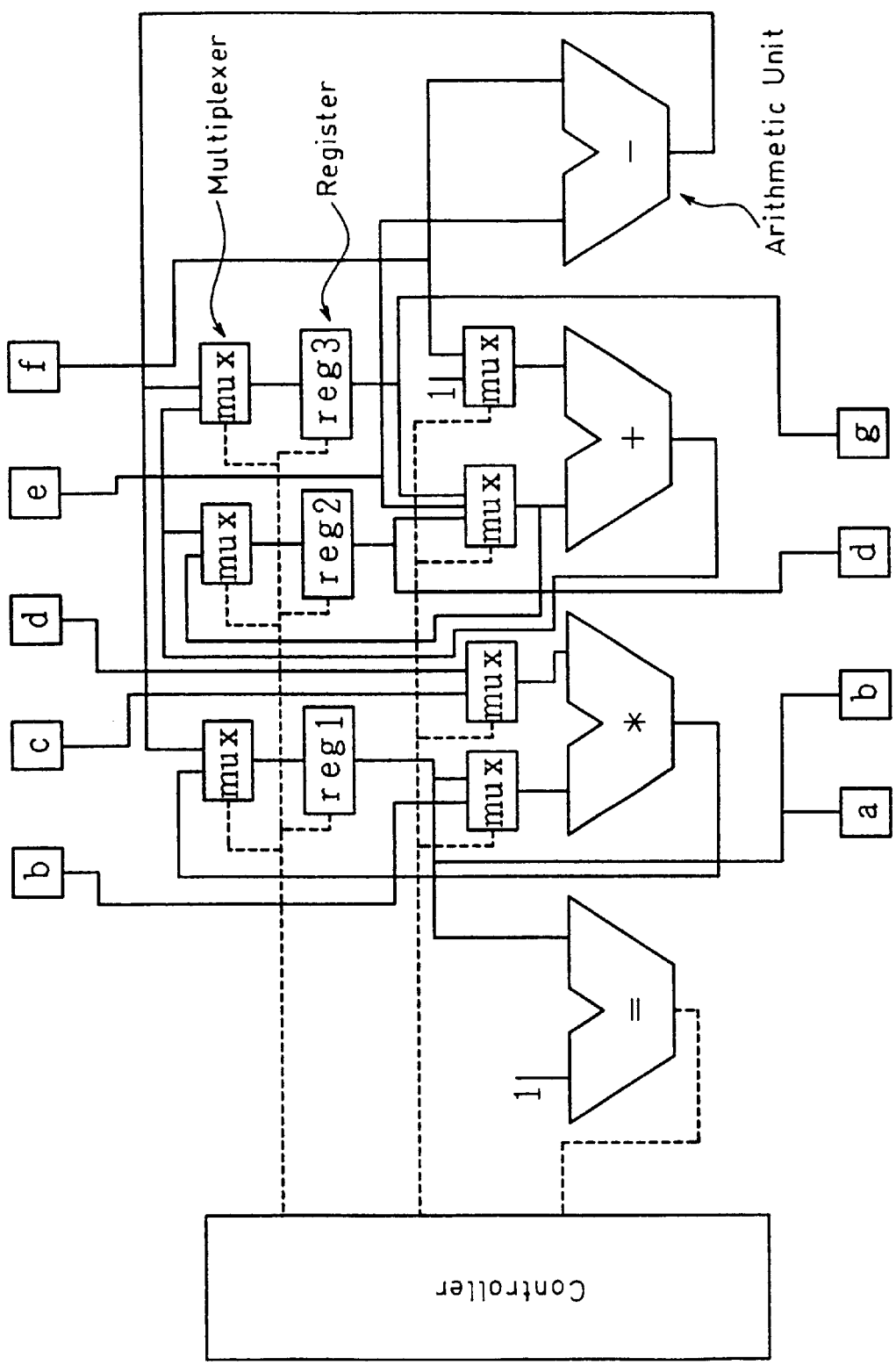
FIG. 26 is an explanatory view showing the result of allocation according to the result of scheduling shown in FIG. 25.
Figure 27:
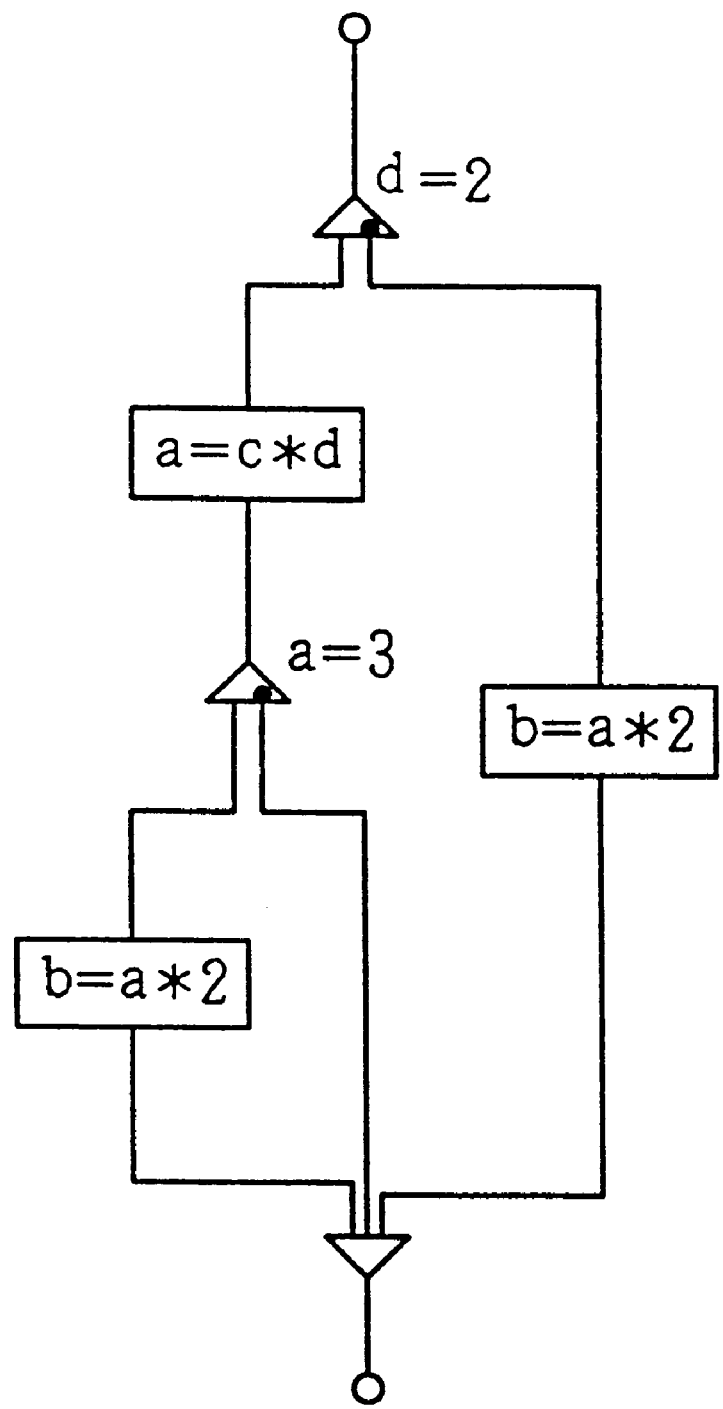
FIG. 27 is a CFG of poor efficiency, generated from the behavioral description shown in FIG. 3(a).
Figure 28:
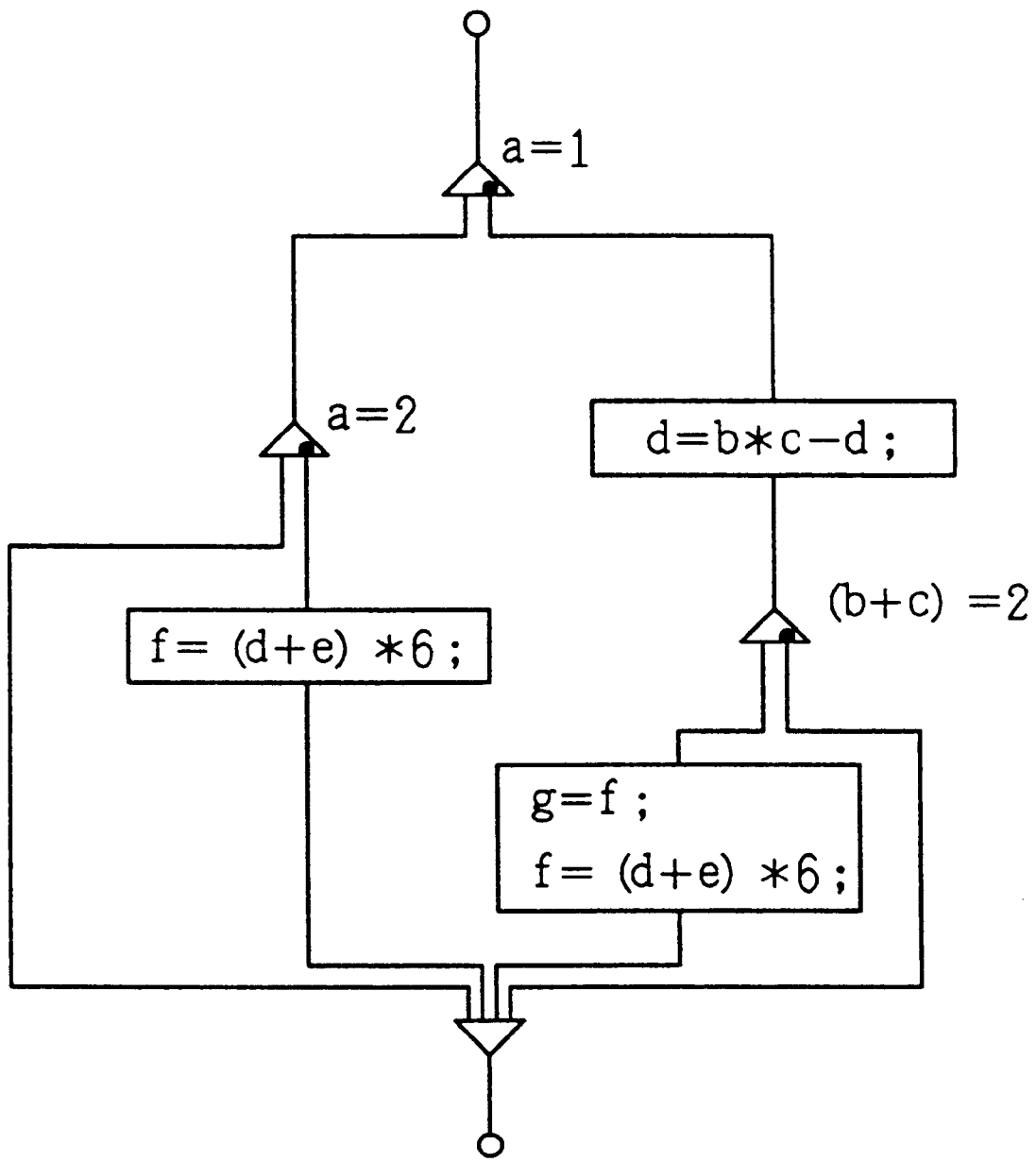
FIG. 28 is a CFG of poor efficiency, generated from the behavioral description shown in FIG. 12(a).

FIG. 20 shows the CDFG produced by converting the CFG, FIG. 21 shows the result of scheduling, and FIG. 22 shows final hardware generated by the allocation.

As described above, in synthesis of hardware from a behavioral description language, the present invention enables a behavioral description to be written in C language which has spread widely in general irrespective of fields, instead of a VHDL language which has been generally used as a dedicated language specialized in a behavioral description language. It is thus possible to describe a behavioral description containing execution control branch instructions which cannot be described in the VHDL language, thereby improving the efficiency of the synthesis of hardware.

In the above, an example of a hardware synthesis device is illustrated as one embodiment of the present invention that synthesizes hardware from a behavioral description containing execution control branch instructions. However, the present invention is not necessarily limited to this embodiment, and is implementable as a program for performing processing according to a hardware synthesis method.

Furthermore, the present invention is applicable to the synthesis of hardware not only from C language including the above-mentioned if-goto statement or switch statement, but also from every computer language including an execution control branch instruction.

As described above, a hardware synthesis method according to the present invention includes the steps of:
 (a) converting a behavioral description including an execution control branch instruction into a control flow graph;
 (b) converting the control flow graph into a control data flow graph;
 (c) performing scheduling according to the control data flow graph; and
 (d) performing allocation according to the result of scheduling.

With this hardware synthesis method, in step (a), a behavioral description including a goto statement to be executed according to a condition may be converted into a control flow graph.

According to this method, it is possible to express a behavioral description including an if-goto statement by a control flow graph using a branch node and a merge node. It is thus possible to synthesize a hardwired circuit for executing the behavior of the if-goto statement, and support the if-goto statement by a behavioral description language for high-level synthesis.

Moreover, in the above-mentioned hardware synthesis method, step (a) may include the steps of:
 dividing the behavioral description into partial descriptions separated by an if-goto statement or a jump destination label;
 representing each of the partial descriptions by one partial control flow graph;
 generating a branch node corresponding to the if-goto statement and branching control flow branches; and
 generating a merge node corresponding to the jump destination label and merging the control flow branches.

With this method, it is possible to convert the behavioral description containing the if-goto statement into a control flow graph without duplication. Therefore, when a high-speed hardwired circuit for executing both of true and false paths at a branch in the control flow graph is generated, the area of the finally synthesized hardwired circuit can be reduced.

Furthermore, according to the above-mentioned hardware synthesis method, in step (a), a behavioral description containing a switch statement written in C language may be converted into a control flow graph.

With this method, the behavioral description containing the switch statement can be expressed by a control flow graph using a branch node and a merge node. It is thus possible to synthesize a hardwired circuit for executing the behavior of the switch statement, and support the switch statement by a behavioral description language for high-level synthesis.

Besides, in the above-mentioned hardware synthesis method, step (a) may include the steps of:
 dividing a subordinate sub-statement of the switch statement into partial descriptions separated by a case constant, a break statement, or an if-break statement;

representing each of the partial descriptions by one partial control flow graph;

generating a branch node corresponding to the if-break statement and branching control flow branches; and generating a merge node corresponding to the case constant or the subordinate sub-statement end point and merging the control flow branches.

With this method, a behavioral description containing a switch statement can be expressed by a control flow graph without duplication. Therefore, when a high-speed hardwired circuit for executing both of true and false paths at a branch in the control flow graph is generated, the area of the finally synthesized hardwired circuit can be reduced.

In addition, a hardware synthesis device according to the present invention includes:

CFG generating means for converting a behavioral description including an execution control branch instruction into a control flow graph;

CDFG generating means for converting the control flow graph into a control data flow graph;

scheduling means for performing scheduling according to the control data flow graph; and allocation means for performing allocation according to the result of scheduling.

Moreover, in the above-mentioned hardware synthesis device, the CFG generating means may be arranged to convert a behavioral description containing a goto statement to be executed according to a condition, into a control flow graph.

With this arrangement, the CFG generating means can express a behavioral description containing an if-goto statement by a control flow graph using a branch node and a merge node. It is thus possible to synthesize a hardwired circuit for executing the behavior of the if-goto statement, and realize a hardware synthesis device supporting the if-goto statement by a behavioral description language for high-level synthesis.

Additionally, in the above-mentioned hardware synthesis device, the CFG generating means may be arranged to include:

dividing means for dividing the behavioral description into partial descriptions separated by an if-goto statement or a jump destination label;

partial CFG generating means for representing each of the partial descriptions by one partial control flow graph;

branch node generating means for generating a branch node corresponding to the if-goto statement and branching control flow branches; and merge node generating means for generating a merge node corresponding to the jump destination label and merging the control flow branches.

With this arrangement, it is possible to convert the behavioral description containing the if-goto statement into a control flow graph without duplication. Therefore, when a high-speed hardwired circuit for executing both of true and false paths at a branch in the control flow graph is generated, the area of the finally synthesized hardwired circuit can be reduced.

Furthermore, according to the above-mentioned hardware synthesis device, the CFG generating means may be arranged to convert a behavioral description containing a switch statement written in C language into a control flow graph.

With this arrangement, the behavioral description containing the switch statement can be expressed by a control flow graph using a branch node and a merge node. It is thus possible to synthesize a hardwired circuit for executing the behavior of the switch statement, and support the switch statement by a behavioral description language for high-level synthesis.

Besides, in the above-mentioned hardware synthesis device, the CFG generating means may be arranged to include:

dividing means for dividing a subordinate sub-statement of the switch statement into partial descriptions separated by a case constant, a break statement, or an if-break statement;

partial CFG generating means for representing each of the partial descriptions by one partial control flow graph;

branch node generating means for generating a branch node corresponding to a conditional expression of the switch statement or the if-break statement and branching control flow branches; and merge node generating means for generating a merge node corresponding to the case constant or the subordinate sub-statement end point and merging the control flow branches.

With this arrangement, the behavioral description containing the switch statement can be converted into a control flow graph without duplication. Therefore, when a high-speed hardwired circuit for executing both of true and false paths at a branch in the control flow graph is generated, the area of the finally synthesized hardwired circuit can be reduced.

In addition, it is possible to construct a recording medium on which a program capable of executing the above-mentioned hardware synthesis method is recorded and which is readable by a computer. More specifically, this recording medium contains a hardware synthesis program recorded thereon, the hardware synthesis program including the steps of:

(a) converting a behavioral description including an execution control branch instruction into a control flow graph;

(b) converting the control flow graph into a control data flow graph;

(c) performing scheduling according to the control data flow graph; and (d) performing allocation according to the result of scheduling.

Moreover, the above-mentioned recording medium may be arranged to convert a behavioral description containing a goto statement to be executed according to a condition, into a control flow graph in step (a) of the hardware synthesis program.

With this recording medium, it is possible to provide means for supporting the behavioral description containing the if-goto statement by a behavioral description language for high-level synthesis.

Furthermore, the above-mentioned recording medium may be arranged so that step (a) of the hardware synthesis program includes the steps of:

dividing the behavioral description into partial descriptions separated by an if-goto statement or a jump destination label;

representing each of the partial descriptions by one partial control flow graph;

generating a branch node corresponding to the if-goto statement and branching control flow branches; and generating a merge node corresponding to the jump destination label and merging the control flow branches.

With this recording medium, by converting the behavioral description containing the if-goto statement into a control flow graph without duplication, it is possible to provide means for synthesizing a high-speed hardwired circuit for executing both of true and false paths, without increasing the area of the circuit.

Additionally, the above-mentioned recording medium may be arranged so that a behavioral description containing a switch statement written in C language is converted into a control flow graph in step (a) of the hardware synthesis program.

With this recording medium, it is possible to provide means for supporting the behavioral description containing the switch statement by a behavioral description language for high-level synthesis.

Besides, the above-mentioned recording medium may be arranged so that step (a) of the hardware synthesis program includes the steps of:

dividing a subordinate sub-statement of the switch statement into partial descriptions separated by a case constant, a break statement, or an if-break statement;

representing each of the partial descriptions by one partial control flow graph;

generating a branch node corresponding to a conditional expression of the switch statement or the if-break statement and branching control flow branches; and generating a merge node corresponding to the case constant or the subordinate sub-statement end point and merging the control flow branches.

With this recording medium, by converting the behavioral description containing the switch statement into a control flow graph without duplication, it is possible to produce an effect of providing means for synthesizing a high-speed hardwired circuit for executing both of true and false paths, without increasing the area of the circuit.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A hardware synthesis method comprising the steps of:
   (a) converting a behavioral description including an execution control branch instruction into a control flow graph;
   (b) converting the control flow graph into a control data flow graph;
   (c) performing scheduling according to the control data flow graph; and
   (d) performing allocation according to a result of scheduling, wherein, in said step (a), a behavioral description including a goto statement to be executed according to a condition is converted into a control flow graph, and
   wherein said step (a) comprises the steps of:
      dividing the behavioral description into partial descriptions separated by an if-goto statement or a jump destination label;
      representing each of the partial descriptions by one partial control flow graph;
      generating a branch node corresponding to the if-goto statement and branching control flow branches; and
      generating a merge node corresponding to the jump destination label and merging the control flow branches.

2. The hardware synthesis method as set forth in claim 1, further comprising the step of repeating the steps comprising step (a) with respect to each of a plurality of goto statements included in the behavioral description.

3. A hardware synthesis method comprising the steps of:
   (a) converting a behavioral description including an execution control branch instruction into a control flow graph;
   (b) converting the control flow graph into a control data flow graph;
   (c) performing scheduling according to the control data flow graph; and
   (d) performing allocation according to a result of scheduling,
   wherein, in said step (a), a behavioral description including a switch statement written in C language is converted into a control flow graph, and
   wherein said step (a) comprises the steps of:
      dividing a subordinate sub-statement of the switch statement into partial descriptions separated by a case constant, a break statement, or an if-break statement;
      representing each of the partial descriptions by one partial control flow graph;
      generating a branch node corresponding to a conditional expression of the switch statement or the if-break statement and branching control flow branches; and
      generating a merge node corresponding to the case constant or a subordinate sub-statement end point and merging the control flow branches.

4. The hardware synthesis method as set forth in claim 3, further comprising the step of repeating the steps comprising step (a) with respect to each of a plurality of switch statements included in the behavioral description.

5. A hardware synthesis device comprising:
   CFG generating means for converting a behavioral description including an execution control branch instruction into a control flow graph;
   CDFG generating means for converting the control flow graph into a control data flow graph;
   scheduling means for performing scheduling according to the control data flow graph; and
   allocation means for performing allocation according to a result of scheduling,
   wherein said CFG generating means converts a behavioral description containing a goto statement to be executed according to a condition, into a control flow graph, and
   wherein said CFG generating means comprises:
      dividing means for dividing the behavioral description into partial descriptions separated by an if-goto statement or a jump destination label;
      partial CFG generating means for representing each of the partial descriptions by one partial control flow graph;
      branch node generating means for generating a branch node corresponding to the if-goto statement and branching control flow branches; and
      merge node generating means for generating a merge node corresponding to the jump destination label and merging the control flow branches.

6. The hardware synthesis device as set forth in claim 5, wherein said CFG generating means comprises means for dividing the behavioral description into partial descriptions with respect to each of a plurality of goto statements included in the behavioral description.

7. A hardware synthesis device comprising:

CFG generating means for converting a behavioral description including an execution control branch instruction into a control flow graph;

CDFG generating means for converting the control flow graph into a control data flow graph;

scheduling means for performing scheduling according to the control data flow graph; and allocation means for performing allocation according to a result of scheduling, wherein said CFG generating means converts a behavioral description including a switch statement written in C language into a control flow graph, and wherein said CFG generating means comprises:
dividing means for dividing a subordinate sub-statement of the switch statement into partial descriptions separated by a case constant, a break statement, or an if-break statement;
partial CFG generating means for representing each of the partial descriptions by one partial control flow graph;
branch node generating means for generating a branch node corresponding to a conditional expression of the switch statement or the if-break statement and branching control flow branches; and
merge node generating means for generating a merge node corresponding to the case constant or a subordinate sub-statement end point and merging the control flow branches.

8. The hardware synthesis device as set forth in claim 7, wherein said CFG generating means comprises means for dividing a subordinate sub-statement of the switch statement into partial descriptions with respect to each of a plurality of switch statements included in the behavioral description.

9. A recording medium containing a hardware synthesis program recorded thereon, said recording medium being readable by a computer, said hardware synthesis program comprising the steps of:

(a) converting a behavioral description including an execution control branch instruction into a control flow graph;

(b) converting the control flow graph into a control data flow graph;

(c) performing scheduling according to the control data flow graph; and (d) performing allocation according to a result of scheduling, wherein, in said step (a), a behavioral description including a goto statement to be executed according to a condition is converted into a control flow graph, and wherein said step (a) comprises the steps of:
dividing the behavioral description into partial descriptions separated by an if-goto statement or a jump destination label;
representing each of the partial descriptions by one partial control flow graph;
generating a branch node corresponding to the if-goto statement and branching control flow branches; and
generating a merge node corresponding to the jump destination label and merging the control flow branches.

10. The recording medium containing the hardware synthesis program recorded thereon as set forth in claim 9, the hardware synthesis program further comprising the step of repeating the steps comprising step (a) with respect to each of a plurality of goto statements included in the behavioral description.

11. A recording medium containing a hardware synthesis program recorded thereon, said recording medium being readable by a computer, said hardware synthesis program comprising the steps of:

(a) converting a behavioral description including an execution control branch instruction into a control flow graph;

(b) converting the control flow graph into a control data flow graph;

(c) performing scheduling according to the control data flow graph; and (d) performing allocation according to a result of scheduling, wherein, in said step (a), a behavioral description including a switch statement written in C language is converted into a control flow graph, and wherein said step (a) comprises the steps of:
dividing a subordinate sub-statement of the switch statement into partial descriptions separated by a case constant, a break statement, or an if-break statement;
representing each of the partial descriptions by one partial control flow graph;
generating a branch node corresponding to a conditional expression of the switch statement or the if-break statement and branching control flow branches; and
generating a merge node corresponding to the case constant or a subordinate sub-statement end point and merging the control flow branches.

12. The recording medium containing the hardware synthesis program recorded thereon as set forth in claim 11, the hardware synthesis program further comprising the step of repeating the steps comprising step (a) with respect to each of a plurality of switch statements included in the behavioral description.

* * * * *